(12) United States Patent
Onishi et al.

(10) Patent No.: US 10,170,346 B2
(45) Date of Patent: Jan. 1, 2019

(54) RESIN SEALING APPARATUS AND RESIN SEALING METHOD

(71) Applicant: TOWA CORPORATION, Kyoto-shi, Kyoto (JP)

(72) Inventors: Yohei Onishi, Kyoto (JP); Takeaki Taka, Kyoto (JP)

(73) Assignee: TOWA CORPORATION, Kyoto-shi, Kyoto (JP)

( * ) Notice: Subject to any disclaimer, the term of this patent is extended or adjusted under 35 U.S.C. 154(b) by 186 days.

(21) Appl. No.: 15/078,926

(22) Filed: Mar. 23, 2016

(65) Prior Publication Data
US 2016/0284576 A1    Sep. 29, 2016

(30) Foreign Application Priority Data

Mar. 23, 2015  (JP) ................................. 2015-059711

(51) Int. Cl.
   *H01L 21/56*       (2006.01)
   *H01L 23/31*       (2006.01)
   (Continued)

(52) U.S. Cl.
   CPC ........ *H01L 21/67126* (2013.01); *B29C 33/42* (2013.01); *B29C 43/021* (2013.01);
   (Continued)

(58) Field of Classification Search
   CPC . H01L 21/565; H01L 21/67126; H01L 23/31; H01L 23/315
   See application file for complete search history.

(56) References Cited

U.S. PATENT DOCUMENTS 4,778,641 A * 10/1988 Chia
5,800,841 A    9/1998 Miyajima
(Continued)

FOREIGN PATENT DOCUMENTS

| CN | 1425547 A | 6/2003 |
|---|---|---|
| CN | 100469550 C | 3/2009 |

(Continued)

OTHER PUBLICATIONS

Office Action received in Korean patent application No. 10-2016-0032103, dated Feb. 20, 2017, 21 pages (including English translation).

(Continued)

*Primary Examiner* — Robert B Davis
(74) *Attorney, Agent, or Firm* — Procopio, Cory, Hargreaves & Savitch LLP

(57) ABSTRACT

A lower mold has a bottom surface member and a side surface member. An upper end surface of the bottom surface member forms an inner bottom surface of a cavity and has a planar shape corresponding to an unusual planar shape of a sealing resin. A substrate is disposed on a mold surface of an upper mold such that a component to be sealed attached to the substrate faces downward, and the cavity is filled with a fluid resin. The upper mold and the lower mold are clamped, and the component is immersed in the fluid resin. The bottom surface member is raised, and the fluid resin is pressed at a prescribed resin pressure and cured to form the sealing resin. The bottom surface member and the side surface member are moved relatively, and thereby, a molded product is released from a mold surface of the lower mold.

16 Claims, 12 Drawing Sheets

(51) Int. Cl.
    *H01L 21/67* (2006.01)
    *B29C 33/42* (2006.01)
    *B29C 43/02* (2006.01)
    *B29C 43/18* (2006.01)
    *B29C 43/56* (2006.01)
    *B29L 31/34* (2006.01)
    *B29C 33/44* (2006.01)
    *B29C 43/36* (2006.01)
    *B29C 43/50* (2006.01)

(52) U.S. Cl.
    CPC .............. *B29C 43/18* (2013.01); *B29C 43/56* (2013.01); *H01L 21/565* (2013.01); *B29C 33/44* (2013.01); *B29C 43/36* (2013.01); *B29C 43/361* (2013.01); *B29C 43/50* (2013.01); *B29C 2043/181* (2013.01); *B29C 2043/182* (2013.01); *B29C 2043/561* (2013.01); *B29C 2043/565* (2013.01); *B29L 2031/34* (2013.01); *B29L 2031/3406* (2013.01); *B29L 2031/3425* (2013.01)

(56) References Cited

U.S. PATENT DOCUMENTS

| | | | |
|---|---|---|---|
| 7,407,608 | B2* | 8/2008 | Miyajima et al. |
| 2003/0099794 | A1 | 5/2003 | Sasaki et al. |
| 2006/0186576 | A1 | 8/2006 | Takase et al. |
| 2009/0068302 | A1* | 3/2009 | Nakamura et al. |
| 2009/0162467 | A1* | 6/2009 | Uragami et al. |
| 2013/0069223 | A1* | 3/2013 | Chen |
| 2016/0013078 | A1* | 1/2016 | Teunissen |

FOREIGN PATENT DOCUMENTS

| | | |
|---|---|---|
| CN | 102529002 A | 7/2012 |
| CN | 103448187 A | 12/2013 |
| JP | H05-131505 A | 5/1993 |
| JP | H08-142109 | 6/1996 |
| JP | 2012-061728 A | 3/2012 |
| JP | 2013-247315 A | 12/2013 |
| KR | 1020070087218 A | 8/2007 |
| KR | 1020120029323 A | 3/2012 |
| KR | 1020130133658 A | 12/2013 |
| KR | 101374331 B1 | 3/2014 |
| TW | 200901341 A | 1/2009 |
| TW | 201219182 A | 5/2012 |
| TW | 201246404 A | 11/2012 |
| TW | 201349401 A | 12/2013 |
| TW | 201507842 A | 3/2015 |

OTHER PUBLICATIONS

The State Intellectual Property Office of P.R. China, First Office Action dated Oct. 10, 2017, application No. 201610165773.4, 21 pages.
Extended European Search Report received in related application 16161708.9 dated Aug. 8, 2016, 10 pages.
Examination Report dated Mar. 22, 2017 for related Taiwan Patent Application No. 105105821 and corresponding Engling Translation, in 29 pages.

* cited by examiner

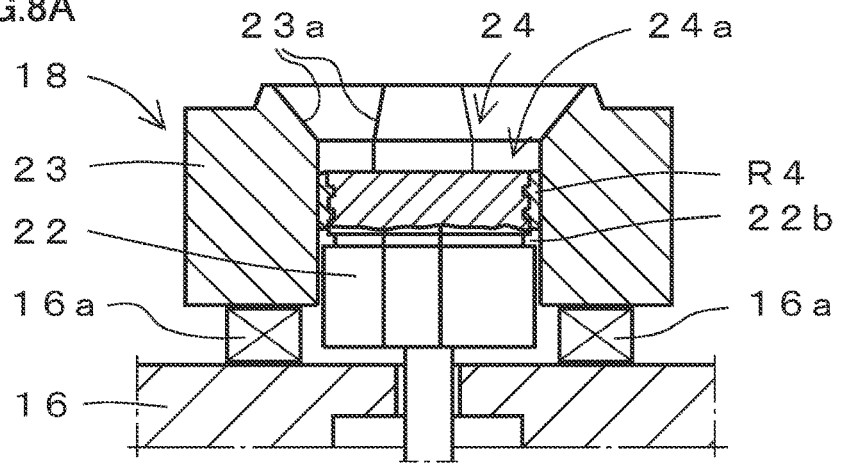
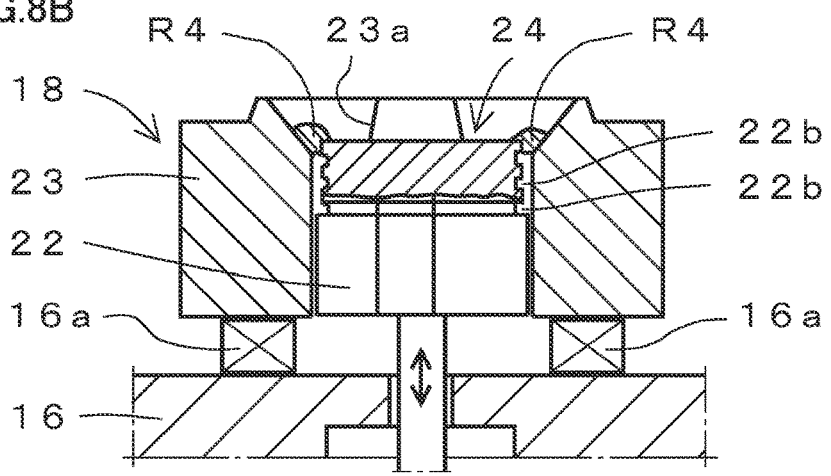
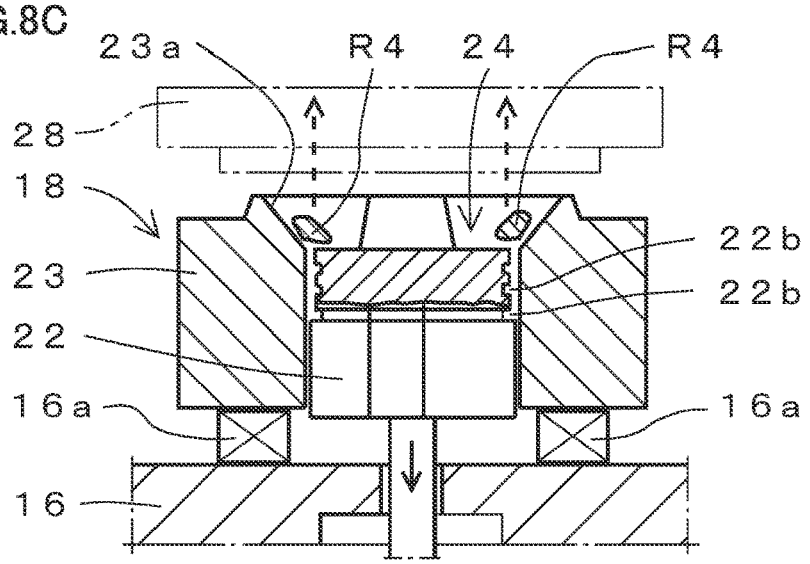

RESIN SEALING APPARATUS AND RESIN SEALING METHOD

BACKGROUND OF THE INVENTION

Field of the Invention

The present invention relates to a resin sealing apparatus and a resin sealing method for providing resin sealing for a component to be sealed attached onto a substrate by a sealing resin.

Description of the Background Art

In order to form a molded product, a cavity formed by a space filled with a fluid resin is formed in a mold for resin sealing. A so-called film molding method is widely known, in which a mold surface of a mold is covered with a mold release film and thus a resin molded product molded within a cavity is easily separated from the mold surface (refer to, for example, Japanese Patent Laying-Open No. 08-142109). According to this film molding method, the die surface (mold surface) of the mold including the cavity is covered with the release film (mold release film) that is easily separated from the molding die (mold) and the molding resin (sealing resin). The mold is clamped, and thereby, a lead frame which is a component to be molded is clamped. A melted resin (fluid resin) is pressure-fed from a pot to the cavity and the fluid resin is cured, and thereby, a sealing resin is formed. Therefore, the pressure is required to pressure-feed the fluid resin from the pot to the cavity formed by the space into which the fluid resin is injected.

A planar shape of an inner bottom surface of the cavity used in this film molding method is normally a simple shape including a substantially rectangular shape (including a square shape and the same is applied to the following description) or a substantially circular shape. Therefore, a planar shape of an end surface (upper end surface) of the sealing resin (hereinafter referred to as "end surface planar shape") is also a simple shape including a substantially rectangular shape or a substantially circular shape. Thus, when resin molding is performed with the mold surface of the resin sealing mold covered with the mold release film, the mold release film allows easy release, from the mold surface, of a sealed substrate (molded product) formed by resin sealing of a component to be sealed.

Recently, in increasing cases, the planar shape (including both the end surface planar shape and a planar shape of a portion where the sealing resin is in close contact with the substrate) of the sealing resin has been neither the substantially rectangular shape nor the substantially circular shape, depending on applications. Throughout the specification, a planar shape that is neither the substantially rectangular shape nor the substantially circular shape will be referred to as "unusual planar shape". First, there is a case in which the inner bottom surface of the cavity has the unusual planar shape. Secondly, there is a case in which an edge portion (a ridge portion forming a boundary between the mold surface subjected to mold clamping and the cavity) of an opening of the cavity has the unusual planar shape. Thirdly, there is a case in which both the inner bottom surface of the cavity and the edge portion of the opening of the cavity have the unusual planar shape.

In order to sufficiently spread the fluid resin over the entire cavity having the inner bottom surface of the unusual planar shape, high pressure is required when pressure-feeding the resin from the pot to the cavity. First, this may cause deformation, break and the like of a wire used to electrically connect the component to be sealed and the substrate. Secondly, this causes an increase in size of a pressing mechanism and therefore an increase in size of a resin sealing apparatus.

SUMMARY OF THE INVENTION

An object of the present invention is to provide a resin sealing apparatus and a resin sealing method that can provide resin sealing for a component to be sealed by a sealing resin having an unusual planar shape.

A resin sealing apparatus according to the present invention is a resin sealing apparatus for providing resin sealing for a component to be sealed by a sealing resin which is cured in a cavity, including:

an upper mold on which a substrate is disposed, a component to be sealed being attached to the substrate;

a lower mold provided to face the upper mold;

a cavity provided at least in the lower mold;

a bottom surface member forming an inner bottom surface of the cavity;

a side surface member forming a side surface of the cavity;

an opening provided in the side surface member and corresponding to an outer circumference of the bottom surface member;

an opening circumferential edge portion provided in the side surface member and having an inner edge shape formed to correspond to an outer edge of an end surface planar shape, an end surface of the sealing resin having the end surface planar shape; and an inclined surface portion provided in the side surface member and inclined to expand upwardly from the opening circumferential edge portion, the side surface member being fitted to the outer circumference of the bottom surface member so as to be slidable on the outer circumference, and the end surface planar shape being an unusual planar shape.

A resin sealing apparatus according to the present invention is a resin sealing apparatus for providing resin sealing for a component to be sealed by a sealing resin which is cured in a cavity, including:

an upper mold on which a substrate is disposed, a component to be sealed being attached to the substrate;

a lower mold provided to face the upper mold;

a cavity provided at least in the lower mold;

a bottom surface member forming an inner bottom surface of the cavity;

a side surface member forming a side surface of the cavity;

an opening provided in the side surface member and corresponding to an outer circumference of the bottom surface member;

an opening circumferential edge portion provided in the side surface member and having an inner edge shape formed to correspond to an outer edge of an end surface planar shape, an end surface of the sealing resin having the end surface planar shape; and an inclined surface portion provided in the side surface member and inclined to expand upwardly from the opening circumferential edge portion, the side surface member being fitted to the outer circumference of the bottom surface member so as to be slidable on the outer circumference, and a planar shape of a portion where the sealing resin is in close contact with the substrate being an unusual planar shape.

According to the present invention, the aforementioned resin sealing apparatus further includes:

a first vertical drive mechanism for moving up and down the side surface member; and a second vertical drive mechanism for moving up and down the bottom surface member, wherein in a process of opening the upper mold and the lower mold, the first vertical drive mechanism and the second vertical drive mechanism independently drive the side surface member and the bottom surface member, respectively, and thereby, the side surface member and the bottom surface member move relatively, and the side surface member and the bottom surface member move relatively, and thereby, the sealing resin is released from a mold surface forming the cavity.

According to the present invention, in the aforementioned resin sealing apparatus, after a sealed substrate formed by resin sealing of the component to be sealed by the sealing resin is taken out, the first vertical drive mechanism and the second vertical drive mechanism independently drive the side surface member and the bottom surface member, respectively, and thereby, the side surface member and the bottom surface member move relatively, and the side surface member and the bottom surface member move relatively, and thereby, a resin burr formed between the side surface member and the bottom surface member is discharged.

According to the present invention, the aforementioned resin sealing apparatus further includes:

a communicating path provided in the lower mold and allowing a mold surface forming the cavity to communicate with an external space external to the lower mold; and an opening formed, by the communicating path, in the mold surface forming the cavity.

According to the present invention, the aforementioned resin sealing apparatus further includes a cavity extension provided at a position and forming the end surface planar shape, the position being continuous to the inclined surface portion of the side surface member, and at the position, the side surface member and the bottom surface member are fitted to each other.

According to the present invention, the aforementioned resin sealing apparatus further includes a seal member provided in a circumferential surface of the outer circumference of the bottom surface member fitted to the side surface member, and having a closed shape when viewed in a plan view.

According to the present invention, the aforementioned resin sealing apparatus further includes:

a frame-like member provided to surround a mold having at least the upper mold and the lower mold;

a space surrounded by the frame-like member and including the cavity;

a seal member for shutting off the space from ambient air; and a pressure reducing mechanism for reducing pressure of the space with the space being shut off from the ambient air, wherein during a period from when the space is shut off from the ambient air to when a step of clamping the upper mold and the lower mold is completed, the pressure of the space shut off from the ambient air is reduced by the pressure reducing mechanism.

According to the present invention, the aforementioned resin sealing apparatus further includes a molding module having at least the upper mold and the lower mold, wherein the molding module can be attached to and detached from another molding module.

A resin sealing method according to the present invention is a resin sealing method for providing resin sealing for a component to be sealed by a sealing resin which is cured in a cavity, by using: an upper mold on which a substrate is disposed, a component to be sealed being attached to the substrate; a lower mold provided to face the upper mold; a cavity provided at least in the lower mold; a bottom surface member forming an inner bottom surface of the cavity; and a side surface member forming a side surface of the cavity, the resin sealing method including the steps of:

preparing the side surface member fitted to an outer circumference of the bottom surface member so as to be slidable on the outer circumference;

preparing the bottom surface member having an end surface, the end surface having an outer edge shape formed to correspond to an outer edge of an end surface planar shape, the end surface forming the inner bottom surface of the cavity;

carrying the substrate in between the upper mold and the lower mold;

disposing the substrate on a mold surface of the upper mold such that the component to be sealed faces downward;

filling the cavity with a fluid resin;

clamping the upper mold and the lower mold, thereby housing the component to be sealed in the cavity;

raising the bottom surface member with the upper mold and the lower mold clamped, thereby pressing the fluid resin in the cavity at a prescribed resin pressure; and curing the fluid resin and forming the sealing resin, with the upper mold and the lower mold clamped, the side surface member being provided with: an opening corresponding to the outer circumference of the bottom surface member; an opening circumferential edge portion having an inner edge shape formed to correspond to the outer edge of the end surface planar shape, the end surface of the sealing resin having the end surface planar shape; and an inclined surface portion inclined to expand upwardly from the opening circumferential edge portion, and the end surface planar shape being an unusual planar shape.

A resin sealing method according to the present invention is a resin sealing method for providing resin sealing for a component to be sealed by a sealing resin which is cured in a cavity, by using: an upper mold on which a substrate is disposed, a component to be sealed being attached to the substrate; a lower mold provided to face the upper mold; a cavity provided at least in the lower mold; a bottom surface member forming an inner bottom surface of the cavity; and a side surface member forming a side surface of the cavity, the resin sealing method including the steps of:

preparing the side surface member fitted to an outer circumference of the bottom surface member so as to be slidable on the outer circumference;

preparing the bottom surface member having an end surface, the end surface having an outer edge shape formed to correspond to an outer edge of an end surface planar shape, the end surface forming the inner bottom surface of the cavity;

carrying the substrate in between the upper mold and the lower mold;

disposing the substrate on a mold surface of the upper mold such that the component to be sealed faces downward;

filling the cavity with a fluid resin;

clamping the upper mold and the lower mold, thereby housing the component to be sealed in the cavity;

raising the bottom surface member with the upper mold and the lower mold clamped, thereby pressing the fluid resin in the cavity at a prescribed resin pressure; and curing the fluid resin and forming the sealing resin, with the upper mold and the lower mold clamped, the side surface member being provided with: an opening corresponding to the outer circumference of the bottom surface member; an opening circumferential edge portion having an inner edge shape formed to correspond to the outer edge of the end surface planar shape, the end surface of the sealing resin having the end surface planar shape; and an inclined surface portion inclined to expand upwardly from the opening circumferential edge portion, and a planar shape of a portion where the sealing resin is in close contact with the substrate being an unusual planar shape.

According to the present invention, the aforementioned resin sealing method further includes the step of opening the upper mold and the lower mold after the step of forming the sealing resin, wherein in the step of opening, the bottom surface member and the side surface member are moved relatively, and thereby, the sealing resin is released from a mold surface forming the cavity.

According to the present invention, the aforementioned resin sealing method further includes the steps of:

after the step of opening, taking out a sealed substrate formed by resin sealing of the component to be sealed by the sealing resin; and after the step of taking out a sealed substrate, relatively moving the bottom surface member and the side surface member, thereby discharging a resin burr formed between the bottom surface member and the side surface member.

According to the present invention, the aforementioned resin sealing method further includes the step of:

after the step of forming the sealing resin, using a communicating path to allow a surface of the sealing resin to communicate with an external space via an opening of the communicating path provided in a mold surface forming the cavity, the communicating path being provided in the lower mold and allowing the mold surface forming the cavity to communicate with the external space external to the lower mold.

According to the present invention, in the aforementioned resin sealing method, a cavity extension forming the end surface planar shape is provided at a position which is continuous to the inclined surface portion of the side surface member and where the side surface member and the bottom surface member are fitted to each other.

According to the present invention, the aforementioned resin sealing method further includes the steps of:

introducing the fluid resin into a recess provided in a circumferential surface of the outer circumference of the bottom surface member fitted to the side surface member, and having a closed shape when viewed in a plan view; and curing the fluid resin in the recess, thereby forming a seal member.

According to the present invention, the aforementioned resin sealing method further includes the steps of:

shutting off a space including the cavity from ambient air by a frame-like member provided to surround a mold having at least the upper mold and the lower mold; and reducing pressure of the space shut off from the ambient air.

According to the present invention, the aforementioned resin sealing method further includes the step of preparing a molding module having at least the upper mold and the lower mold, wherein the molding module can be attached to and detached from another molding module.

According to the present invention, the bottom surface member forming the inner bottom surface of the cavity and the side surface member forming the side surface of the cavity are used. The side surface member is provided with: the opening corresponding to the outer circumference of the bottom surface member; the opening circumferential edge portion having the inner edge shape formed to correspond to the outer edge of the end surface planar shape, the end surface of the sealing resin having the end surface planar shape; and the inclined surface portion inclined to expand upwardly from the opening circumferential edge portion. The bottom surface member is raised with the upper mold and the lower mold clamped, and thereby, the fluid resin in the cavity is pressed at the prescribed resin pressure. As a result, first, when the upper end surface of the sealing resin has the unusual planar shape, the fluid resin can be sufficiently spread in the cavity having the inner bottom surface of the planar shape corresponding to the unusual planar shape. Secondly, when the planar shape of the portion where the sealing resin is in close contact with the substrate is the unusual planar shape, the fluid resin can be sufficiently spread in the cavity in which the planar shape of the portion in contact with the substrate is the unusual planar shape. The fluid resin in the cavity can be pressed at a pressure lower than the pressure for pressure-feeding the resin to the cavity. Therefore, deformation, break and the like of the wire as well as an increase in size of the resin sealing apparatus can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B show a main portion of a resin sealing mold corresponding to FIG. 1, in which FIG. 4A is a partially cutaway front view at the time of opening the resin sealing mold and FIG. 4B is a plan view of the lower mold portion.

FIGS. 5A and 5B show the resin sealing mold corresponding to FIGS. 4A and 4B, in which FIG. 5A is a partially cutaway front view at the time of clamping the resin sealing mold and FIG. 5B is a partially cutaway front view showing a mold opening state after molding.

FIGS. 6A and 6B show another configuration example of the resin sealing mold, in which FIG. 6A is a partially cutaway front view at the time of opening the resin sealing mold and FIG. 6B is a plan view of the lower mold portion.

FIGS. 7A and 7B are explanatory diagrams of an annular seal member, in which FIG. 7A is a partially cutaway front view at the time of opening the resin sealing mold and FIG. 7B is an enlarged longitudinal cross-sectional view of a main portion of the annular seal member.

FIGS. 8A to 8C are longitudinal cross-sectional views of the lower mold portion and show each step when discharging outside a resin burr having adhered to a fitting surface between a bottom surface member and a side surface member.

DESCRIPTION OF THE PREFERRED EMBODIMENTS

Figure 1:
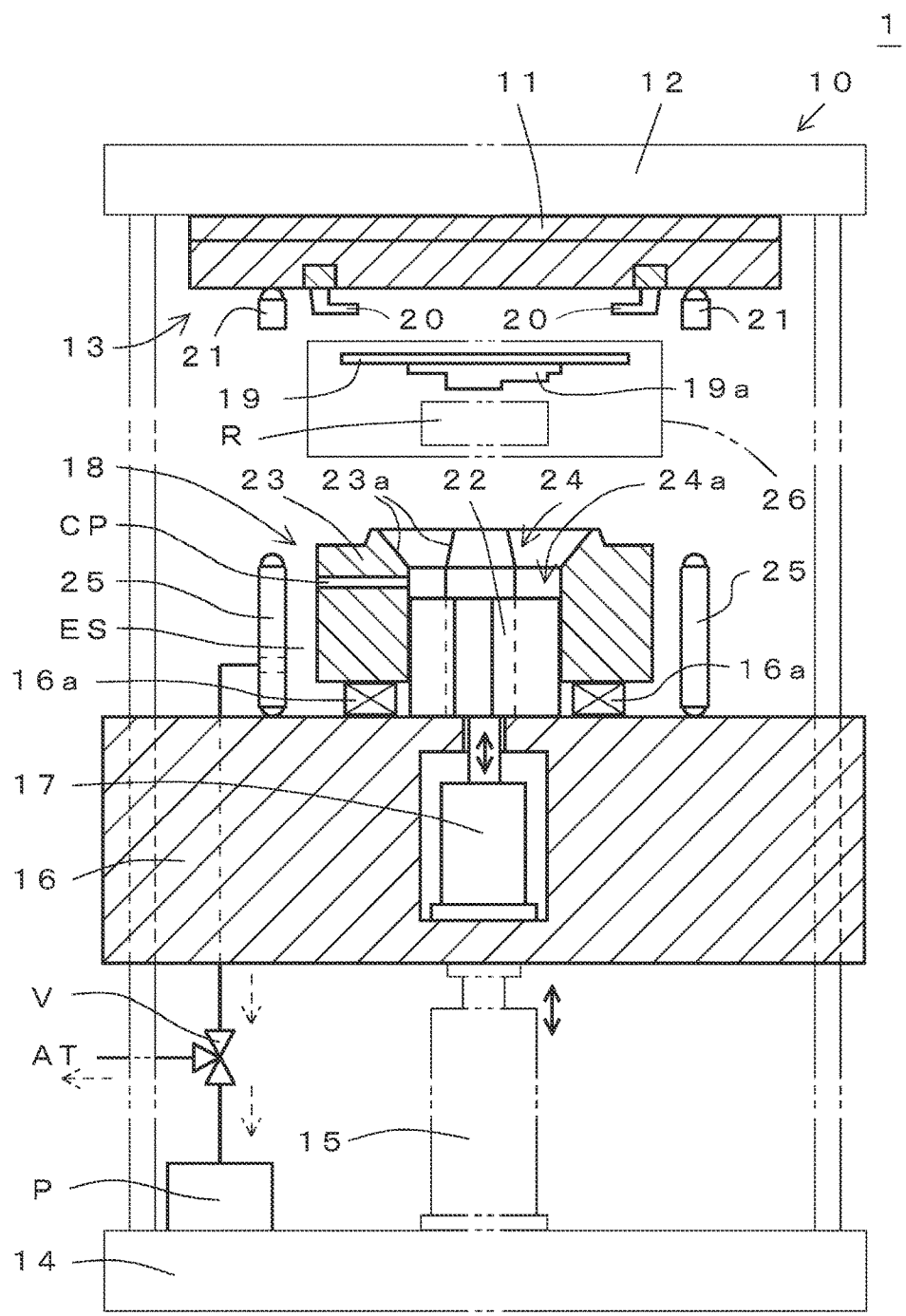
FIG. 1 schematically shows a resin sealing apparatus according to the present invention and is a partially cutaway front view showing a state in which a substrate and a resin material have been conveyed to a resin sealing mold portion.

An upper mold 13 on which a substrate 19 having a component to be sealed 19a attached thereto is disposed, and a lower mold 18 facing upper mold 13 are used. Lower mold 18 has a bottom surface member 22 forming an inner bottom surface of a cavity 24, and a side surface member 23 forming an inner side surface of cavity 24. An upper end surface of bottom surface member 22 forms the inner bottom surface of cavity 24. The inner bottom surface of cavity 24 has a planar shape corresponding to an unusual planar shape of an upper end surface of a sealing resin. Side surface member 23 is fitted to an outer circumference of bottom surface member 22 so as to be slidable on the outer circumference. Substrate 19 is disposed on a mold surface of upper mold 13 such that component to be sealed 19a faces downward. Upper mold 13 and lower mold 18 are clamped, and thereby, component to be sealed 19a is immersed in a fluid resin R1 filled into cavity 24. Then, bottom surface member 22 is raised, and thereby, fluid resin R1 in cavity 24 is pressed at a prescribed resin pressure and cured to form a sealing resin R2. At the time of opening upper mold 13 and lower mold 18, bottom surface member 22 and side surface member 23 are moved relatively, and thereby, a molded product M is released from the mold surface forming cavity 24.

First Embodiment

A first embodiment of a resin sealing apparatus and a resin sealing method according to the present invention will be described with reference to FIGS. 1 to 8C. For the sake of clarity, any drawings throughout the specification are schematic and omission or exaggeration is made as appropriate. As shown in FIGS. 1 to 5B, a resin sealing apparatus 1 according to the present invention has a molding module 10. As described below (refer to FIG. 12), molding module 10 can be attached to and separated from another module (such as a material receiving module and another molding module 10). The present invention is not limited to such resin sealing apparatus having molding module 10.

Molding module 10 includes an upper mold base 11, and upper mold 13 attached to a lower surface of a fixed platen 12 with upper mold base 11 interposed therebetween. Molding module 10 includes a base 14, a vertical drive mechanism 15 attached onto base 14, and a movable platen 16 provided to be capable of being raised and lowered by vertical drive mechanism 15. A vertical drive mechanism 17 is attached to movable platen 16. Lower mold 18 is attached to an upper surface of movable platen 16 with an elastic member 16a interposed therebetween. A mold surface (lower surface) of upper mold 13 and a mold surface (upper surface) of lower mold 18 are arranged vertically to face each other. Upper mold 13 and lower mold 18 together form a resin sealing mold (mold for resin sealing). Each of vertical drive mechanism 15 and vertical drive mechanism 17 may be formed by, for example, an AC servo motor, a ball screw and a ball nut. Each of vertical drive mechanism 15 and vertical drive mechanism 17 may be an air cylinder, a hydraulic cylinder or the like.

By raising and lowering lower mold 18 on movable platen 16 by vertical drive mechanism 15, mold opening for opening the mold surface of upper mold 13 and the mold surface of lower mold 18 (refer to FIG. 1) and mold clamping for closing the mold surface of upper mold 13 and the mold surface of lower mold 18 (refer to FIGS. 2 and 3) can be performed. Vertical drive mechanism 15 for raising and lowering movable platen 16 forms a mold opening and closing mechanism.

A substrate locking mechanism (damper) 20 for temporarily fixing substrate 19 such that component to be sealed 19a attached to substrate 19 faces downward is provided on the mold surface of upper mold 13. A frame-like seal member 21 for sealing a prescribed range including upper mold 13 and lower mold 18 (for shutting off the prescribed range from the ambient air) is arranged around the periphery of substrate locking mechanism 20 on the mold surface of upper mold 13. Substrate 19 may be temporarily fixed by suction.

Figure 5A:
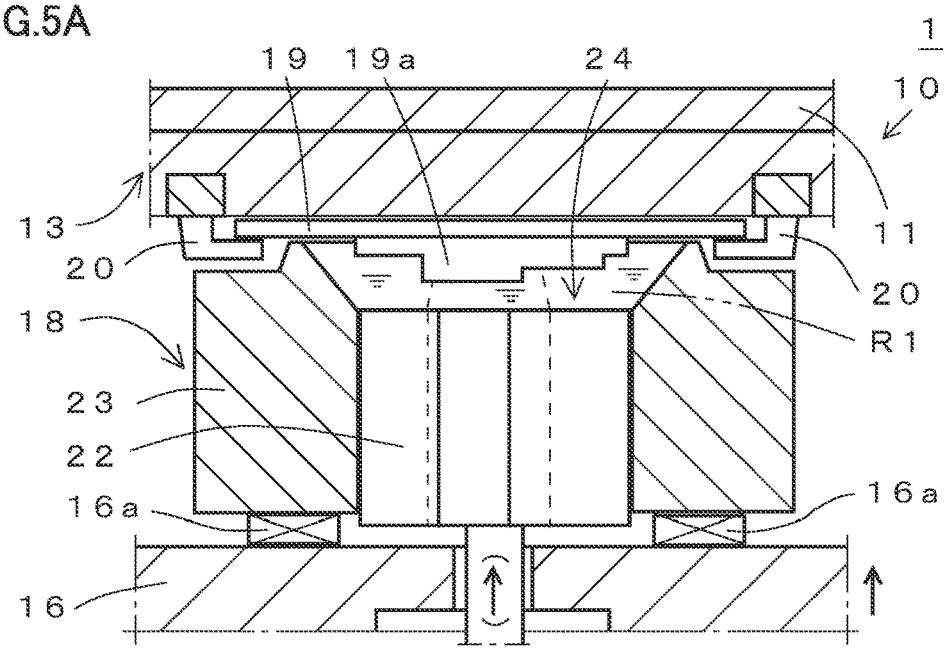
Figure 5B:
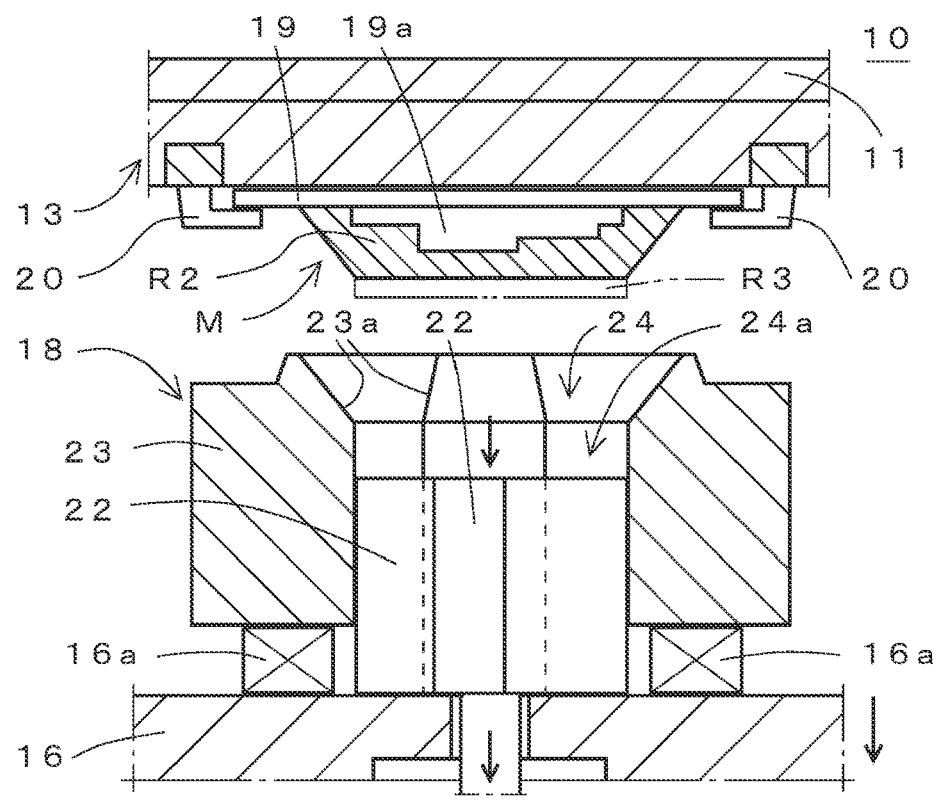

Lower mold 18 is provided with bottom surface member 22, and side surface member 23 fitted to the outer circumference of bottom surface member 22 to be slidable in the vertical direction. Cavity 24 for resin molding is formed above the upper end surface of bottom surface member 22 in the portion where bottom surface member 22 and side surface member 23 are fitted to each other. Cavity 24 is a space surrounded by the upper end surface of bottom surface member 22 and an inner side surface of side surface member 23. As shown in FIGS. 5A and 5B, inside cavity 24, fluid resin R1 formed from a resin material R shown in FIG. 1 is cured, and thereby, sealing resin R2 is formed. Side surface member 23 has an opening having a shape corresponding to an outer circumferential shape of bottom surface member 22. A circumferential edge portion of the opening (opening circumferential edge portion) has an inner edge shape formed to correspond to an outer edge of an end surface planar shape of the upper end surface of sealing resin R2.

Figure 4A:
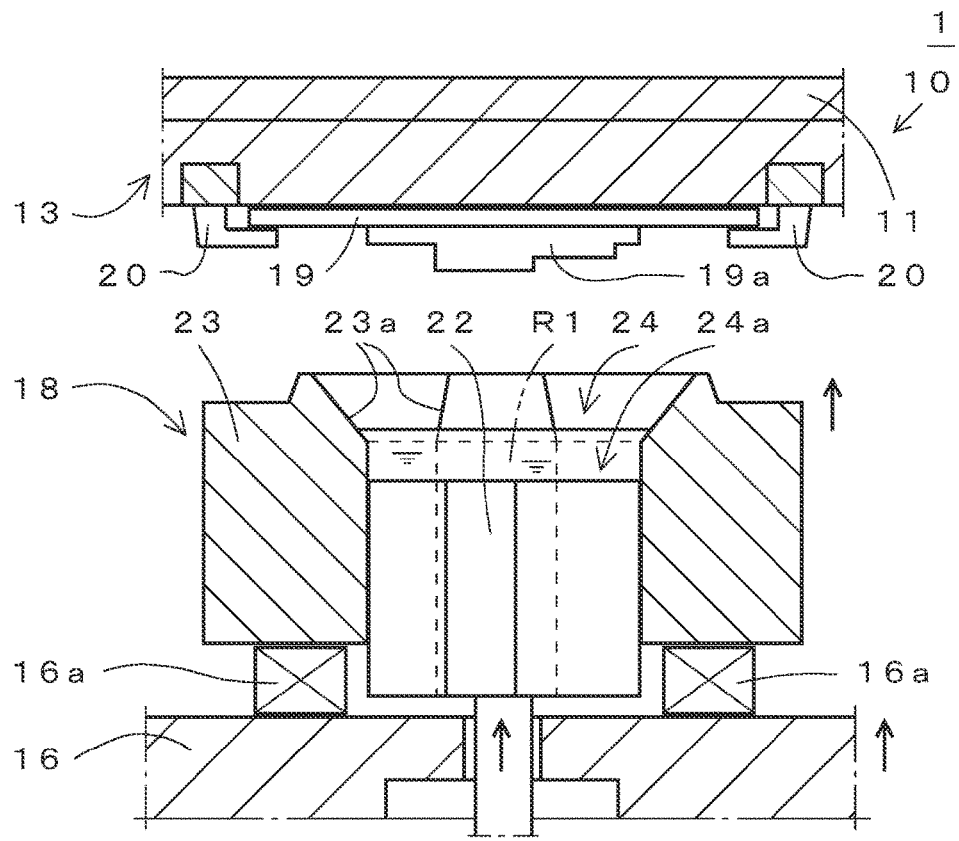
Figure 4B:
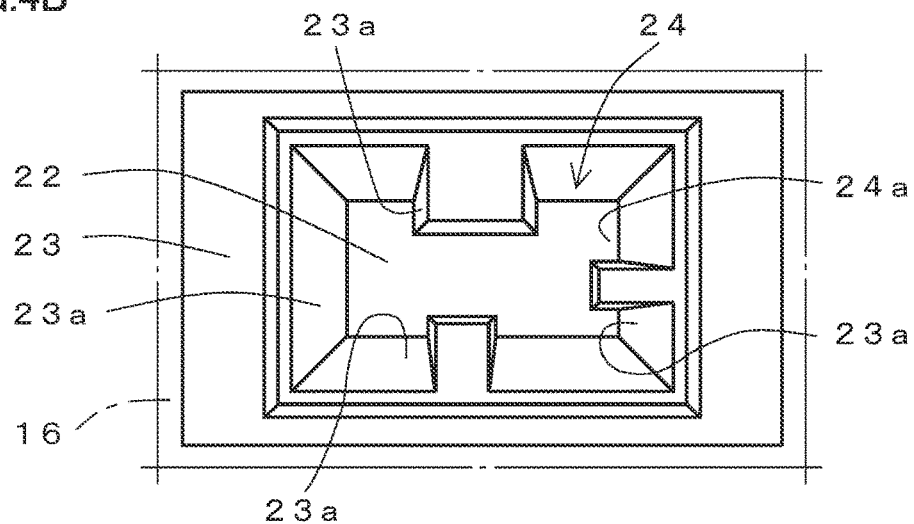

A planar shape of the opening circumferential edge portion in side surface member 23 is formed to correspond to the planar shape of the upper end surface (corresponding to the lower surface in FIG. 5B, and simply referred to as "end surface" hereinafter) of sealing resin R2 having the unusual planar shape (refer to FIGS. 4B and 5B). Therefore, the inner bottom surface of bottom surface member 22 corresponding to the end surface of sealing resin R2 also has a planar shape of the unusual planar shape. The opening circumferential edge portion of side surface member 23 is provided with an inclined surface portion 23a formed by a surface inclined to expand upwardly.

An example of the unusual planar shape includes a shape having a cutaway portion(s) or a projecting portion(s) on one side or a plurality of sides of a rectangular shape. Other examples include a substantially circular shape having a cutaway portion or a projecting portion, a polygonal shape other than the rectangular shape, and the like. A substrate having the substantially circular shape includes a nearly circular semiconductor substrate (such as a silicon substrate) having a cutaway portion called "Orientation Flat" or "notch" for indicating a direction such as crystal orientation in the substrate.

Figure 2:
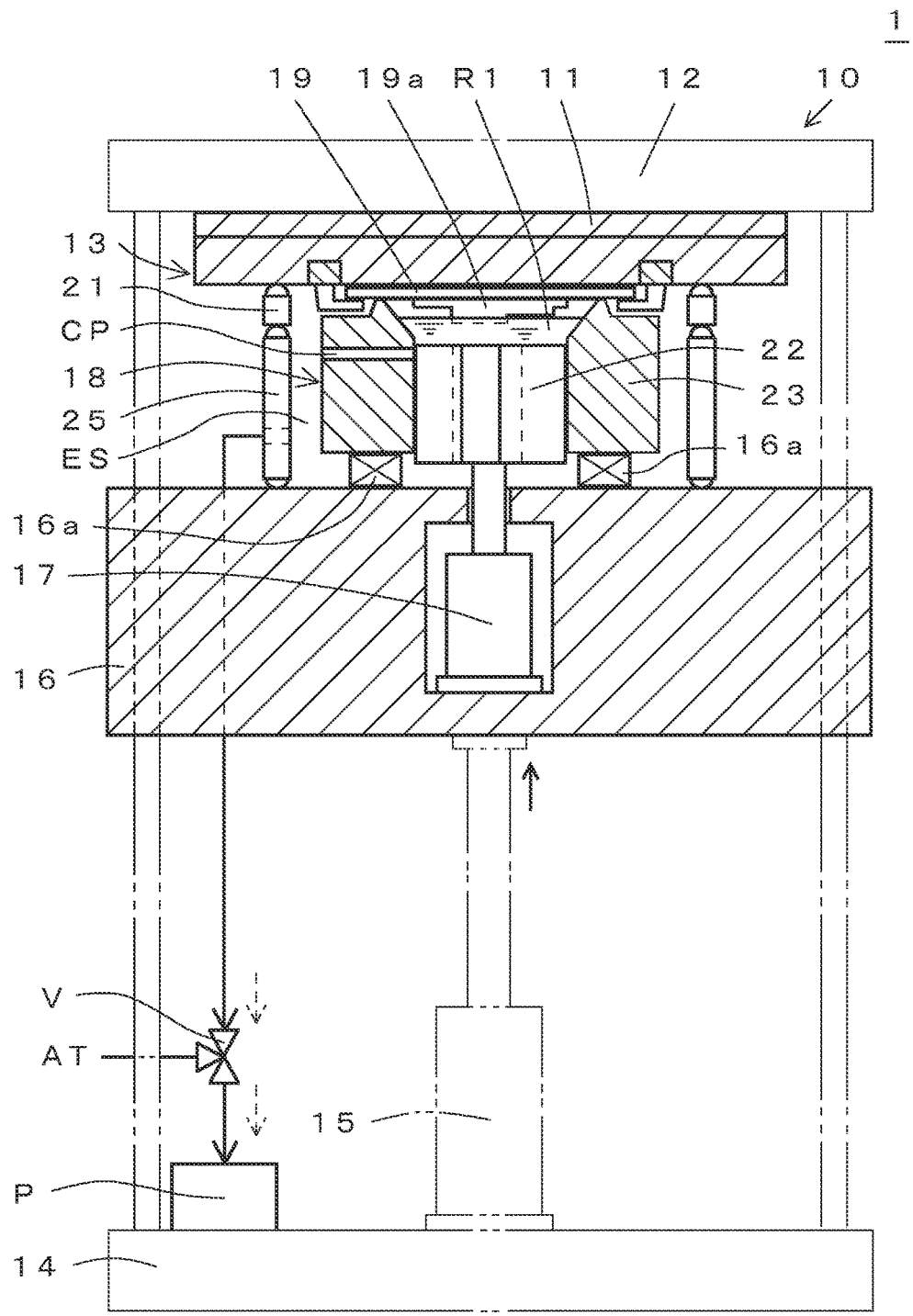
FIG. 2 is a partially cutaway front view of the resin sealing apparatus corresponding to FIG. 1 and shows a primary mold clamping state of an upper mold and a lower mold.
Figure 3:
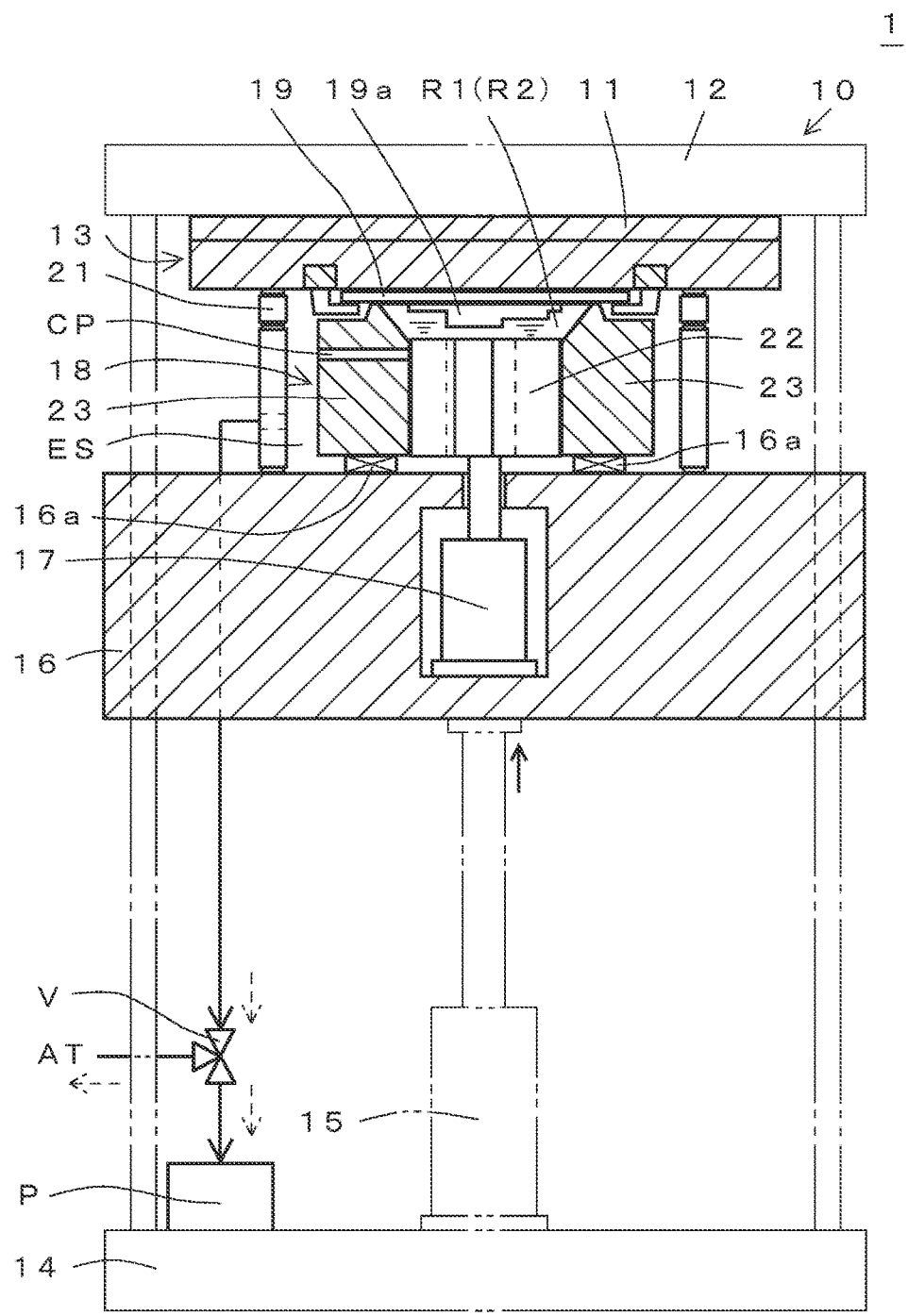
FIG. 3 is a partially cutaway front view of the resin sealing apparatus corresponding to FIG. 1 and shows a secondary mold clamping state of the upper mold and the lower mold.

As shown in FIGS. 1 to 3, in side surface member 23, a communicating path CP (described below) may be formed below the position of the upper end surface of bottom surface member 22 when cavity 24 is formed. In the figures, illustration of communicating path CP is omitted as appropriate.

By being driven by vertical drive mechanism 17 attached to movable platen 16, bottom surface member 22 can slide in the vertical direction. Side surface member 23 is raised and lowered in accordance with movable platen 16 raised and lowered by vertical drive mechanism 15. Vertical drive mechanism 17 for raising and lowering bottom surface member 22 is attached to movable platen 16. Therefore, in accordance with raising and lowering of movable platen 16, bottom surface member 22 is raised and lowered together with vertical drive mechanism 17.

As described above, bottom surface member 22 can be raised and lowered. Therefore, first, the position of the upper surface of bottom surface member 22 can be adjusted in the vertical direction in accordance with a state of housing resin material R supplied into cavity 24 and fluid resin R1 shown in FIG. 2 (refer to FIG. 2). Secondly, with upper mold 13 and lower mold 18 clamped, bottom surface member 22 can be raised by using vertical drive mechanism 17. As a result, a prescribed resin pressure can be applied to resin material R in cavity 24 and fluid resin R1. Vertical drive mechanism 17 forms a resin pressing mechanism (refer to FIG. 3).

Resin sealing apparatus 1 separately includes vertical drive mechanism 17 for moving up and down bottom surface member 22, and vertical drive mechanism 15 for moving up and down side surface member 23. Vertical drive mechanism 15 and vertical drive mechanism 17 operate individually (i.e., independently). Specifically, vertical drive mechanism 15 drives side surface member 23 and raises and lowers side surface member 23. Vertical drive mechanism 17 drives bottom surface member 22 and raises and lowers bottom surface member 22.

Movable platen 16 is provided with a frame-like seal member 25 at a position facing seal member 21 provided at upper mold 13. In a step of clamping upper mold 13 and lower mold 18, seal member 21 and seal member 25 cooperate to shut off an external space ES including upper mold 13 and lower mold 18 from the ambient air. By using a pressure reducing source such as a vacuum pump P, the gas in external space ES formed by seal member 21 and seal member 25 and shut off from the ambient air can be actively discharged outside external space ES. A switching valve V for allowing external space ES to communicate with atmosphere AT may be provided. In the figures, illustration of vacuum pump P, switching valve V, a pipe for connecting these, and the like is omitted as appropriate.

With upper mold 13 and lower mold 18 opened (refer to FIG. 1), a conveyance mechanism 26 for substrate 19 and resin material R is moved to a prescribed position between the mold surface of upper mold 13 and the mold surface of lower mold 18. Substrate 19 carried in by conveyance mechanism 26 is temporarily fixed to a prescribed position on the mold surface of upper mold 13 by using substrate locking mechanism 20. Resin material R carried in by conveyance mechanism 26 is supplied into cavity 24 of lower mold 18. Lower mold 18 is provided with heating means (not shown) for heating cavity 24 and its surroundings and heating resin material R supplied into cavity 24 to a prescribed resin molding temperature.

An arbitrary material can be used as resin material R. For example, a liquid resin (resin that is in a liquid state at ordinary temperature) can be used, in addition to a solid resin such as a tablet-like resin, a granular resin, a fine-grained resin, a powdery resin, and a sheet-like resin. When the liquid resin is used, the liquid resin itself corresponds to fluid resin R1. A thermosetting resin such as an epoxy resin and a silicone resin can be used as resin material R.

As shown in FIG. 1, a cavity extension 24a may be formed at a position which is continuous to inclined surface portion 23a of side surface member 23 and where side surface member 23 and bottom surface member 22 are fitted to each other. Cavity extension 24a is a part of cavity 24 and is a space where a sealing resin extension R3 (refer to FIG. 5B) constituting a part of sealing resin R2 is formed.

Figure 6A:
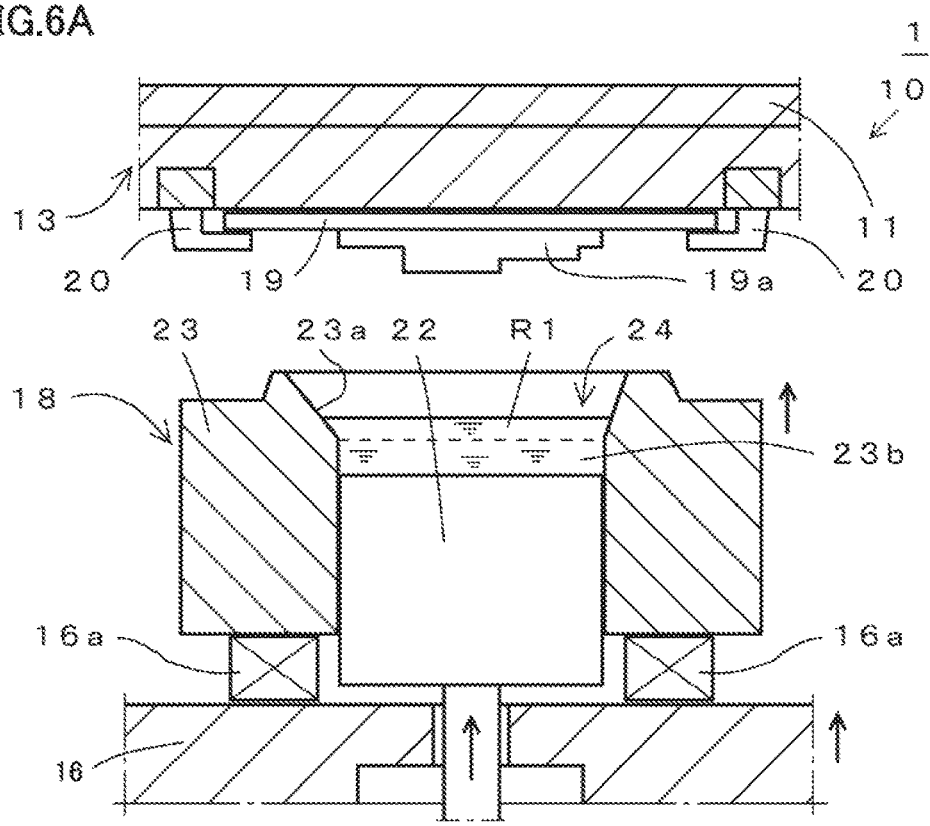
Figure 6B:
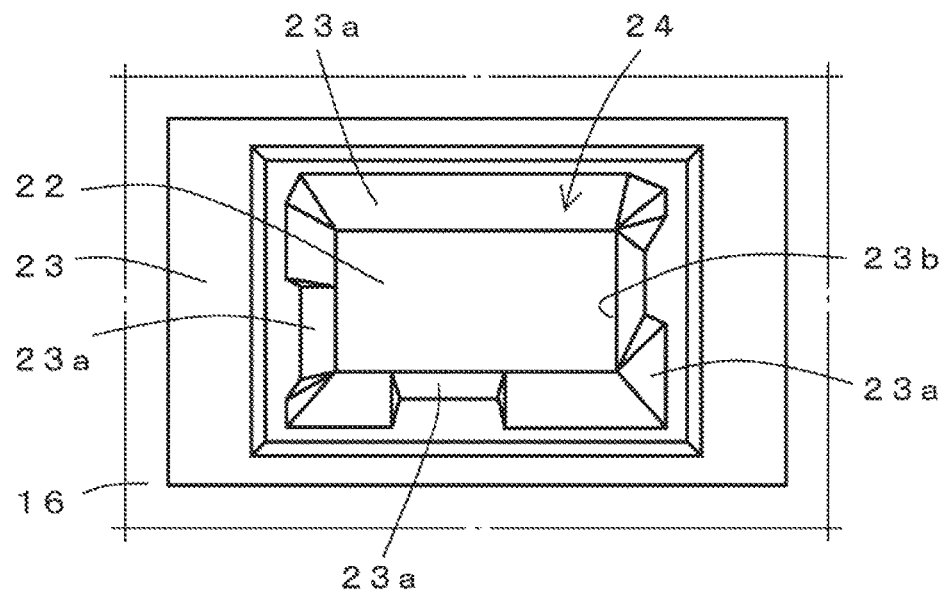

Cavity 24a for forming sealing resin extension R3 constituting a part of sealing resin R2 is not necessarily needed. The case of not needing cavity 24a is the case of not needing to form sealing resin extension R3. Specifically, it is the case in which the upper surface of sealing resin R2 has a rectangular shape and a portion of sealing resin R2 covering substrate 19 has an unusual planar shape (refer to FIGS. 6A and 6B). In this case, a normal configuration may be employed as a manner of fitting side surface member 23 and bottom surface member 22 to each other. As shown in FIG. 6B, bottom surface member 22 is formed to have a rectangular planar shape. A rectangular hole 23b for fitting bottom surface member 22 is formed in side surface member 23. In this case, a planar shape of the upper surface portion (portion that is in contact with substrate 19) of cavity 24 is the unusual planar shape. Rectangular hole 23b is a space in which bottom surface member 22 slides.

The circumferential surface of bottom surface member 22 fitted to side surface member 23 may be provided with an annular seal member. During resin molding, this can prevent resin leakage from the portion where bottom surface member 22 and side surface member 23 are fitted to each other. A planar shape of the annular seal member is a shape corresponding to the planar shape of the upper end surface of bottom surface member 22, and may be any of a circular shape, a rectangular shape and an unusual planar shape.

Figure 7A:
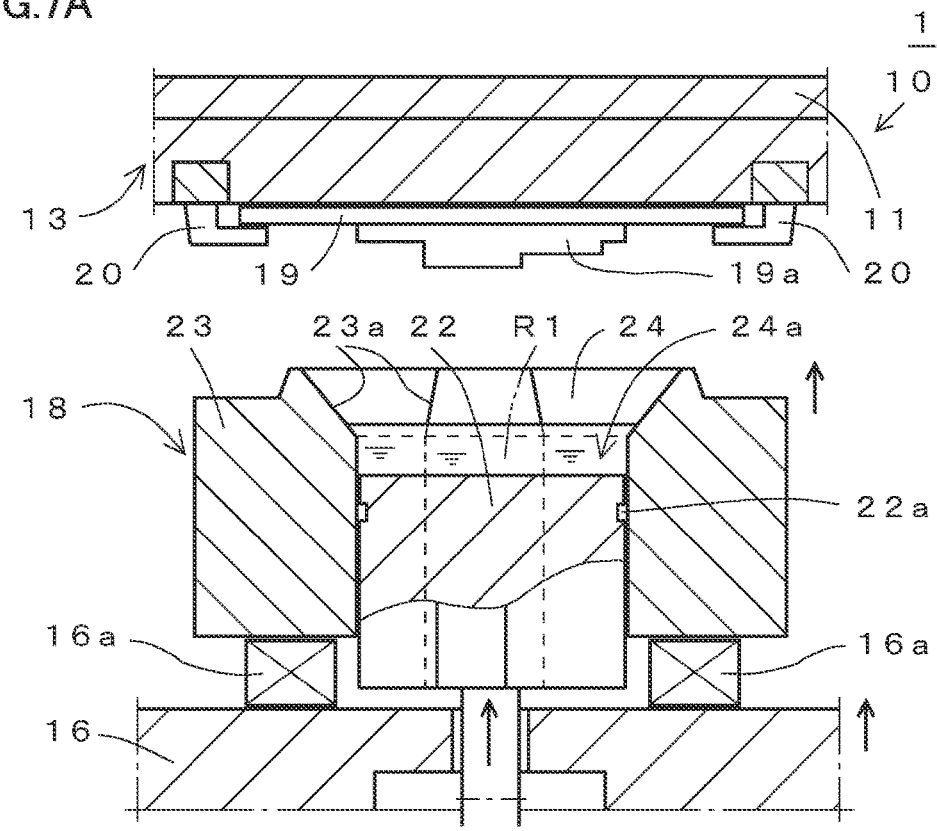
Figure 7B:
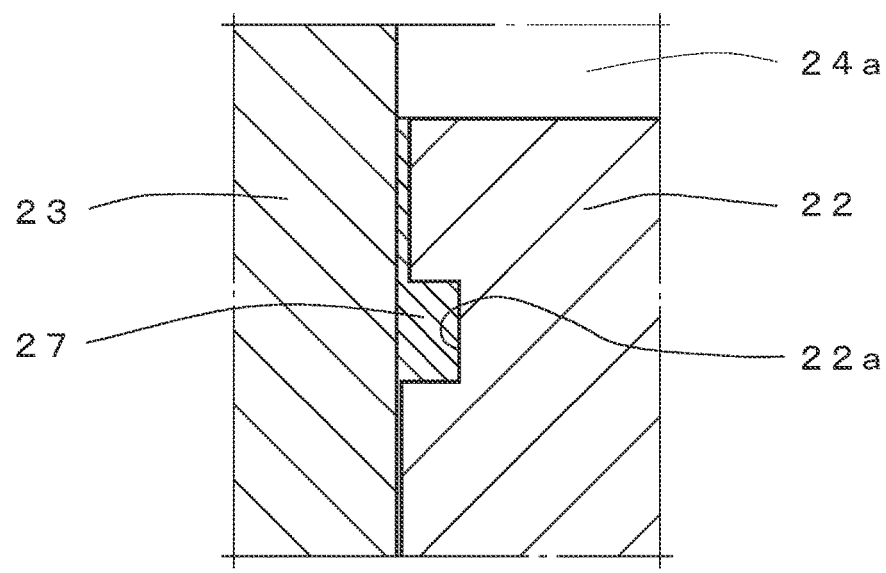

For example, as shown in FIGS. 7A and 7B, a recess 22a having a required depth is formed in the circumferential surface of the upper end of bottom surface member 22, and a required gap is provided between bottom surface member 22 and side surface member 23. In the early stage of resin molding, a part of fluid resin R1 is introduced into recess 22a and cured. As a result, this cured resin can form a seal member 27.

In the continuously performed resin molding operation, a part of fluid resin R1 enters the circumferential surface where bottom surface member 22 and side surface member 23 are fitted to each other and fluid resin R1 is cured, and thus, a so-called resin burr is formed in some cases. Since this resin burr inhibits sliding of bottom surface member 22, resin molding may become impossible. By removing this resin burr, the operating rate of the resin molding apparatus may be enhanced.

For example, when a resin burr R4 adheres to the circumferential surface where bottom surface member 22 and side surface member 23 are fitted to each other as shown in FIG. 8A, bottom surface member 22 and side surface member 23 are first relatively slid up and down as shown in FIG. 8B. As a result, resin burr R4 is discharged to an upper portion of an inner surface of cavity 24. Next, as shown in FIG. 8C, discharged resin burr R4 is captured and forcibly discharged outside by using an appropriate suction-type cleaner 28.

FIGS. 8A to 8C show resin burr discharge means having recesses 22b of a required depth provided at a plurality of positions (three positions, i.e., upper, middle and lower positions, on the outer circumferential surface in the figures) on the circumferential surface of the upper end of bottom surface member 22 in order to enhance the discharge efficiency of resin burr R4. This resin burr discharge means may, for example, be configured such that recess 22b is arranged at only one position on the outer circumferential surface of the upper end of bottom surface member 22.

Hereinafter, the case of providing resin sealing for component to be sealed 19a on substrate 19 by using resin sealing apparatus 1 will be described with reference to FIG. 1. First, side surface member 23 is prepared. The shape of the opening circumferential edge portion of side surface member 23 is formed to correspond to the outer edge having the unusual planar shape of the end surface of sealing resin R2. The opening circumferential edge portion of side surface member 23 is provided with inclined surface portion 23a inclined to expand upwardly.

Next, as shown in FIG. 1, substrate 19 and resin material R are carried in between the mold surface of upper mold 13 and the mold surface of lower mold 18 by using conveyance mechanism 26.

Next, as shown in FIG. 2, carried-in substrate 19 is supplied to the mold surface of upper mold 13 such that component to be sealed 19a faces downward. Substrate 19 is temporarily fixed to the mold surface of upper mold 13 by using means such as suction and clamp. Carried-in resin material R is supplied into cavity 24 formed by the upper surface of side surface member 23 and the inner side surface of bottom surface member 22. Carry-in of substrate 19 may be performed before or after carry-in of resin material R. Carry-in of substrate 19 and carry-in of resin material R may be performed in parallel (simultaneously).

As shown in FIGS. 2 and 4A, resin material R supplied into cavity 24 is heated to a prescribed resin molding temperature (e.g., 175° C.) and melted by using the heating means (not shown). As a result, resin material R is melted to form fluid resin R1 made of the melted resin. Therefore, it is possible to obtain the state in which cavity 24 is filled with fluid resin R1.

As shown in FIGS. 2 and 3, after cavity 24 is filled with fluid resin R1, upper mold 13 and lower mold 18 are clamped to close the mold surface of upper mold 13 and the mold surface of lower mold 18 (refer to FIG. 5A). As a result, component to be sealed 19a on substrate 19 disposed on the mold surface of upper mold 13 is immersed (soaked) in fluid resin R1 filled into cavity 24.

During a period from the start of clamping of upper mold 13 and lower mold 18 to the end of clamping, external space ES including cavity 24 can be sealed by using seal member 21 and seal member 25 provided between the mold surface of upper mold 13 and the mold surface of lower mold 18. In other words, external space ES surrounded by seal member 21 and seal member 25 is shut off from the ambient air. By using vacuum pump P serving as the pressure reducing source, the gas present in external space ES shut off from the ambient air is discharged outside external space ES. As a result, it is possible to suppress occurrence of voids in sealing resin R2 (refer to FIG. 5B) formed by curing fluid resin R1. A large-capacity pressure reducing tank sucked by vacuum pump P may be used as the pressure reducing source.

As shown in FIG. 3, with component to be sealed 19a being immersed in fluid resin R1 filled into cavity 24, bottom surface member 22 is raised by using vertical drive mechanism 15. As a result, fluid resin R1 in cavity 24 is pressed to a prescribed resin pressure. Then, fluid resin R1 in cavity 24 is heated at a prescribed resin molding temperature for a prescribed molding time (e.g., 120 seconds), while pressing fluid resin R1 in cavity 24 at the prescribed resin pressure. Fluid resin R1 is heated and cured to form sealing resin (resin package) R2 made of the cured resin. Component to be sealed 19a on substrate 19 is resin-sealed in sealing resin R2 molded to correspond to the shape of cavity 24 and having the upper end surface of the unusual planar shape (refer to FIG. 5B). Through the steps described so far, molded product (resin-sealed substrate) M having component to be sealed 19a, substrate 19 and sealing resin R2 is completed (refer to FIG. 5B).

In the present embodiment, resin sealing apparatus 1 includes vertical drive mechanism 17 for bottom surface member 22 and vertical drive mechanism 15 for side surface member 23, which are separately drivable. Hereinafter, the operation of vertical drive mechanism 15 and vertical drive mechanism 17 will be described.

As shown in FIG. 1, bottom surface member 22 is provided to be vertically slidable. The height position of the upper surface of bottom surface member 22 needs to be adjusted in the vertical direction in accordance with the state of housing resin material R supplied into cavity 24 or fluid resin R1. In this case, the height position of the upper end surface of bottom surface member 22 (the inner bottom surface of cavity 24) can be adjusted by using vertical drive mechanism 17 for bottom surface member 22.

For example, when resin material R is supplied into cavity 24, the height position of the upper surface of bottom surface member 22 is lowered to an appropriate height position. When a prescribed resin pressure is applied to fluid resin R1 in cavity 24, the height position of the upper surface of bottom surface member 22 is adjusted. When the upper surface of bottom surface member 22 is raised to a height position required to mold sealing resin R2 (resin package) to a prescribed thickness, the height position of the upper surface of bottom surface member 22 is adjusted.

The step of adjusting the height position of the upper surface of bottom surface member 22 is performed in, for example, an arbitrary molding process described below. First, the step is performed in a state where upper mold 13 and lower mold 18 are opened as shown in FIG. 1. Secondly, the step is performed in a state where upper mold 13 and lower mold 18 are intermediately clamped as shown in FIG. 2 (primary mold clamping state). Thirdly, the step is performed in a state where upper mold 13 and lower mold 18 are completely clamped as shown in FIG. 3 (secondary mold clamping state). In the secondary mold clamping state, a prescribed resin pressure is applied to fluid resin R1 in cavity 24. FIG. 2 shows the case in which the relative height position of the upper surface of bottom surface member 22 with respect to side surface member 23 is raised as compared with the height position shown in FIG. 1.

As shown in FIG. 2, when movable platen 16 is raised by using vertical drive mechanism 15 arranged on base 14, side surface member 23 provided on movable platen 16 with elastic member 16a interposed therebetween is also raised simultaneously. When movable platen 16 is further raised by using vertical drive mechanism 15, the upper surface portion surrounding the opening of side surface member 23 presses the circumferential edge portion of the lower surface of substrate 19 fixed to the mold surface of upper mold 13. As a result, the primary mold clamping which is the intermediate mold clamping is performed.

Next, as shown in FIG. 3, movable platen 16 is further raised by using vertical drive mechanism 15. The height position of the upper surface of bottom surface member 22 supported by movable platen 16 and vertical drive mechanism 17 is raised to a prescribed height position. As a result, the height position of the upper surface of bottom surface member 22 is set at the prescribed height position and the secondary mold clamping which is the complete mold clamping is performed. The height position of the upper surface of bottom surface member 22 at the time of the secondary mold clamping is preset based on the premise that the height position is set by vertical drive mechanism 15. With the height position of the upper surface of bottom surface member 22 being at the prescribed height position, first, bottom surface member 22 can apply a prescribed resin pressure to fluid resin R1 in cavity 24. Secondly, the thickness of sealing resin (resin package) R2 can be molded to a prescribed thickness. As needed, bottom surface member 22 may be driven by using vertical drive mechanism 17, to apply the prescribed resin pressure to fluid resin R1.

The height position of the upper surface of bottom surface member 22 at the time of the secondary mold clamping does not necessarily need to be set by vertical drive mechanism 15. In this case, for example, movable platen 16 is first raised by vertical drive mechanism 15 and the primary mold clamping is performed. Next, bottom surface member 22 is raised to a prescribed height position by using vertical drive mechanism 17, and thereby, the height position of the upper surface of bottom surface member 22 is set at the prescribed height position. As a result, the prescribed resin pressure is applied to fluid resin R1 present in cavity 24 and fluid resin R1 is cured. Therefore, the thickness of cured sealing resin R2 can be molded to a prescribed thickness. In this case, the height position of the upper surface of bottom surface member 22 at the time of the secondary mold clamping is preset based on the premise that the height position is set by vertical drive mechanism 17.

The operation of applying the prescribed resin pressure to fluid resin R1 in cavity 24 continues for a prescribed molding time. Thereafter, upper mold 13 and lower mold 18 are opened and moved to the original position (refer to FIG. 5B). In this step, molded product M is released from the mold surface of lower mold 18.

Specifically, after cured resin R2 is formed from the state shown in FIGS. 3 and 5A, side surface member 23 is lowered, with the upper end surface (upper surface in the figures) of bottom surface member 22 pressing the end surface (lower surface in the figures) of sealing resin R2. In this case, at the same speed as the speed of lowering side surface member 23, bottom surface member 22 is raised by using vertical drive mechanism 17. By this operation, the state of bottom surface member 22 being at a stop when viewed from outside resin sealing apparatus 1 is maintained. Therefore, side surface member 23 is lowered, while maintaining the state in which bottom surface member 22 is pressing the end surface of sealing resin R2. As a result, the side surface of sealing resin R2 can be released from the inner side surface of side surface member 23.

In the case of raising or lowering side surface member 23 at a certain speed, while maintaining the state of bottom surface member 22 being at a stop when viewed from outside resin sealing apparatus 1, bottom surface member 22 is lowered or raised at the same speed in synchronization with the operation of side surface member 23, by using vertical drive mechanism 17. Since this operation needs to be performed in the following steps as well, description of this operation will not be repeated.

Next, side surface member 23 is raised and the side surface of sealing resin R2 is pressed by the inner side surface of side surface member 23. Next, with the side surface of sealing resin R2 being pressed by the inner side surface of side surface member 23, bottom surface member 22 is lowered. As a result, the end surface of sealing resin R2 is released from the upper end surface of bottom surface member 22. Through the steps described so far, molded product M temporarily fixed to the mold surface of upper mold 13 can be easily released from the mold surface of lower mold 18.

Next, fixation of molded product M by substrate locking mechanism 20 is released and molded product M is taken out to between the mold surface of upper mold 13 and the mold surface of lower mold 18. By using a carry-out mechanism (not shown), molded product M is carried out to the outside of the mold.

In the step of releasing molded product M from the mold, bottom surface member 22 may be first lowered, with the side surface of sealing resin R2 being pressed by the inner side surface of side surface member 23. In this case, side surface member 23 is thereafter lowered, with the end surface of sealing resin R2 being pressed by the upper end surface of bottom surface member 22.

When external space ES formed by seal member 21 and seal member 25 is shut off from the ambient air, the pressure of external space ES is reduced and resin sealing is performed as shown in FIGS. 2 to 3, it is preferable to perform a series of steps described below.

First, before starting the step of releasing molded product M from the mold, external space ES shut off from the ambient air is opened to atmosphere AT by using switching valve V shown in FIGS. 1 to 3. As a result, the pressure of external space ES becomes atmospheric pressure. Next, bottom surface member 22 is lowered, with the side surface of sealing resin R2 being pressed by the inner side surface of side surface member 23. As a result, the end surface of sealing resin R2 is released from the upper end surface of bottom surface member 22.

Immediately after the end surface of sealing resin R2 is released from the upper end surface of bottom surface member 22, the pressure of a gap between the upper end surface of bottom surface member 22 and the end surface of sealing resin R2 becomes atmospheric pressure due to communicating path CP. In the step of opening the mold, the pressure of a minute space between the mold surface (lower surface in the figures) of upper mold 13 and the non-sealed surface (upper surface in the figures) of substrate 19 becomes atmospheric pressure in some cases. In this case, breakage of molded product M by the downward force caused by the atmospheric pressure can be prevented.

According to the present embodiment, the planar shape of the opening circumferential edge portion of side surface member 23 is formed to correspond to the planar shape of the end surface of sealing resin R2 having the unusual planar shape. The opening circumferential edge portion of side surface member 23 is provided with inclined surface portion 23a inclined to expand upwardly. In addition, by raising bottom surface member 22, the prescribed resin pressure is directly applied to fluid resin R1 present in cavity 24.

With the foregoing, first, so-called low pressure molding becomes possible, which is different from the case of pressing fluid resin R1 in cavity 24 by fluid resin R1 injected into cavity 24. Therefore, deformation, break and the like of a wire used to electrically connect the component to be sealed and the substrate can be suppressed. An increase in size of the pressing mechanism and therefore an increase in size of resin sealing apparatus 1 can be suppressed. In addition, resin molding can be reliably performed in detail for the inside of cavity 24 and the inside of cavity extension 24a. Therefore, molded product (resin-sealed substrate) M having the sealing resin of the unusual planar shape can be easily manufactured. Even when a high resin pressure cannot be applied to component to be sealed 19a, such as, for example, the case in which a pressure sensor having an MEMS structure is included in component to be sealed 19a, component to be sealed 19a can be reliably resin-sealed.

Secondly, the mold release property of the molded product can be ensured by inclined surface portion 23a provided at the opening circumferential edge portion of side surface member 23. In addition, in the step of opening upper mold 13 and lower mold 18, side surface member 23 and bottom surface member 22 are moved relatively, and thereby, molded product M is released from the mold. With the foregoing, the use of a mold release film is not required when sealing resin R2 having the unusual planar shape is molded. Therefore, it is possible to resolve a problem that close contact of the mold release film along the mold surface of the cavity becomes difficult and the molding quality decreases as well as a problem that the mold release film breaks.

As shown in FIG. 5B, cavity extension 24a formed by a space continuous to cavity 24 may be formed below cavity 24. Cavity extension 24a is formed at a position which is continuous to inclined surface portion 23a of side surface member 23 and where side surface member 23 and bottom surface member 22 are fitted to each other. The cured resin cured in cavity extension 24a forms sealing resin extension R3 (portion shown by a two-dot chain line) included in sealing resin R2. The planar shape of the inner bottom surface of cavity extension 24a corresponds to the end surface planar shape of sealing resin R2, i.e., the end surface planar shape of sealing resin extension R3.

Second Embodiment

Figure 9:
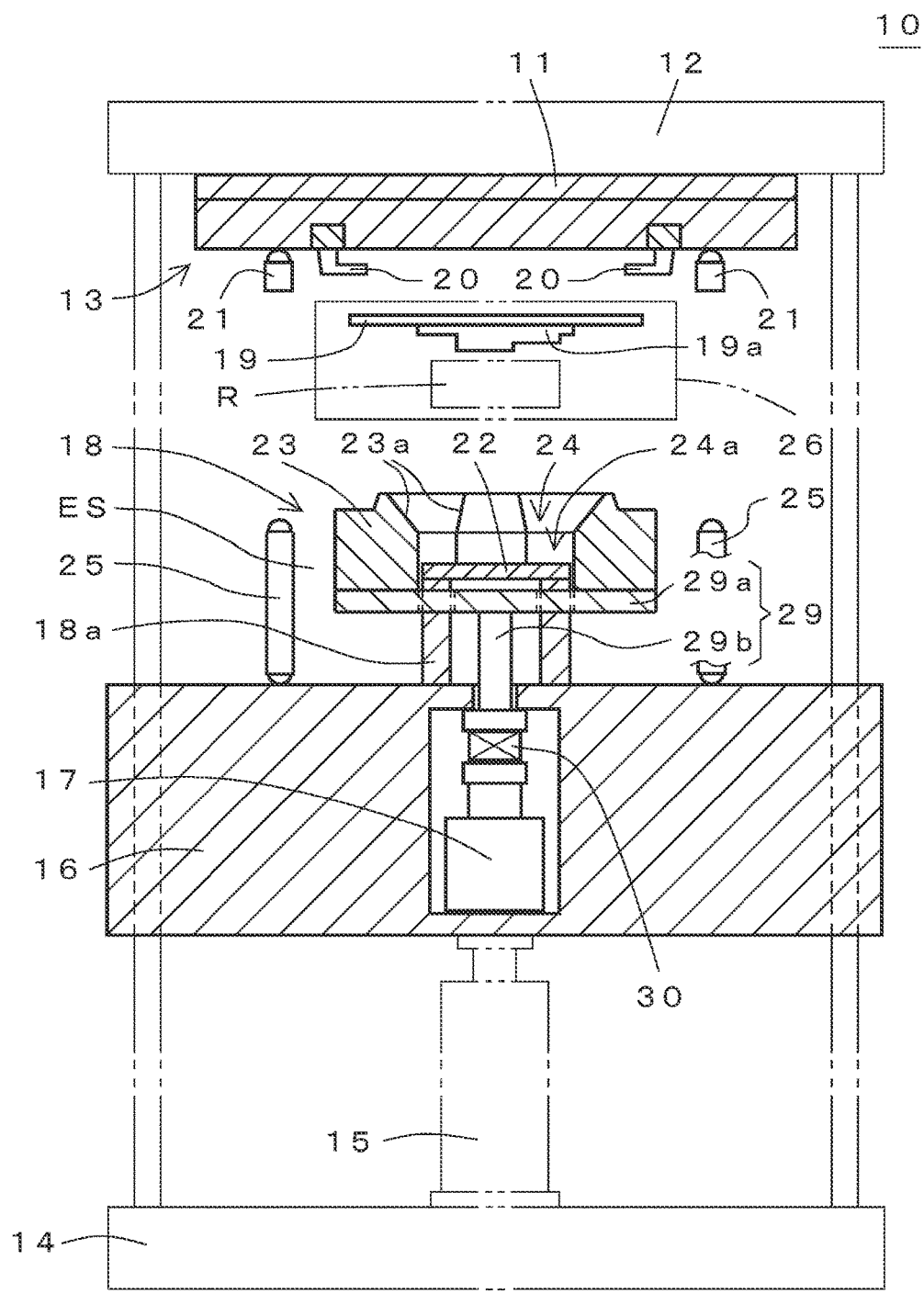
FIG. 9 schematically shows another resin sealing apparatus according to the present invention and is a partially cutaway front view showing a state in which a substrate and a resin material have been conveyed to a resin sealing mold portion.
Figure 10:
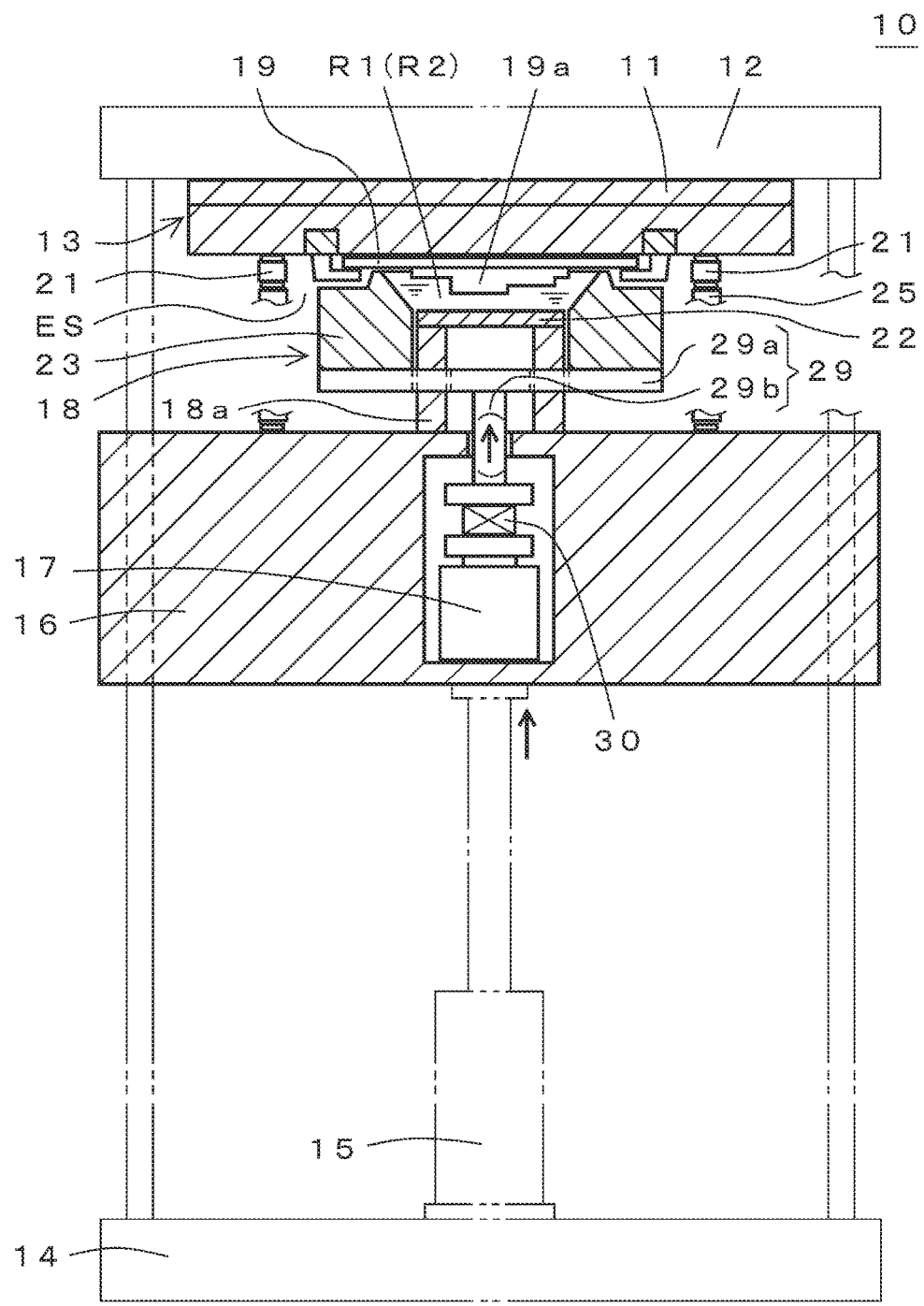
FIG. 10 is a partially cutaway front view of the resin sealing apparatus corresponding to FIG. 9 and shows a clamping state of an upper mold and a lower mold.

A second embodiment of the resin sealing apparatus and the resin sealing method according to the present invention will be described with reference to FIGS. 9 to 10. In the first embodiment, vertical drive mechanism 15 for driving side surface member 23 is attached to base 14. Vertical drive mechanism 17 for driving bottom surface member 22 is attached to movable platen 16 raised and lowered by vertical drive mechanism 15. The present embodiment describes another configuration in which vertical drive mechanism 15 and vertical drive mechanism 17 are provided separately. The components in the present embodiment that are substantially the same as those in the first embodiment have been described in the first embodiment. The common components in the two embodiments are denoted by the same reference characters and description thereof will not be repeated.

Differences between the present embodiment and the first embodiment will be described. As shown in FIGS. 9 to 10, lower mold 18 is provided with bottom surface member 22, and side surface member 23 fitted to the outer circumference of bottom surface member 22. Bottom surface member 22 is fixed to the upper surface of movable platen 16 with a lower mold base 18a interposed therebetween. Therefore, bottom surface member 22 is raised and lowered in accordance with movable platen 16 raised and lowered by vertical drive mechanism 15 attached onto base 14.

A bottom surface of side surface member 23 is attached to a horizontal frame portion 29a of a frame-like coupling member 29. A base portion of a vertical frame 29b fixed to a lower surface of horizontal frame portion 29a is coupled to vertical drive mechanism 17 attached to movable platen 16, with an elastic member 30 interposed therebetween. Frame-like coupling member 29 is provided to be capable of being relatively raised and lowered with respect to movable platen 16 and lower mold base 18a. Therefore, side surface member 23 can be raised and lowered by vertical drive mechanism 17 attached to movable platen 16. When side surface member 23 is raised or lowered by vertical drive mechanism 17, bottom surface member 22 fixed to the upper surface of movable platen 16 with lower mold base 18a interposed therebetween slides to be relatively lowered or raised with respect to side surface member 23.

First, the present embodiment is different from the first embodiment in terms of employing the configuration in which side surface member 23 is raised and lowered by vertical drive mechanism 17 attached to movable platen 16. Secondly, the present embodiment is different from the first embodiment in terms of employing the configuration in which bottom surface member 22 is raised and lowered by vertical drive mechanism 15 attached onto base 14. However, first, the present embodiment is the same as the first embodiment in terms of employing the configuration including two vertical drive mechanisms, i.e., vertical drive mechanism 15 and vertical drive mechanism 17. Secondly, the present embodiment is the same as the first embodiment in terms of employing the configuration in which vertical drive mechanism 15 and vertical drive mechanism 17 are separately drivable.

Bottom surface member 22 is fixed to the upper surface of movable platen 16. When the height position of the upper surface of bottom surface member 22 needs to be adjusted in the vertical direction in accordance with the state of housing the resin material supplied into cavity 24, side surface member 23 is raised or lowered by vertical drive mechanism 17 attached to movable platen 16. As a result, bottom surface member 22 is slid to be relatively lowered or raised with respect to side surface member 23. Therefore, the height position of the upper surface of bottom surface member 22, i.e., the depth of cavity 24 can be adjusted. The step of adjusting the height position of the upper surface of bottom surface member 22 is performed in an arbitrary molding process. This is similar to the first embodiment. According to the present embodiment, the effect similar to that of the first embodiment is obtained.

Third Embodiment

A third embodiment of the resin sealing apparatus and the resin sealing method according to the present invention will be described with reference to FIGS. 11A and 11B. The present embodiment is related to the manner of using communicating path CP shown in FIGS. 1 to 3 to allow a gap 40 between the inner bottom surface of the cavity (the upper end surface of bottom surface member 22) and the end surface of sealing resin R2 to communicate with external space ES which is a space outside the mold.

Figure 11A:
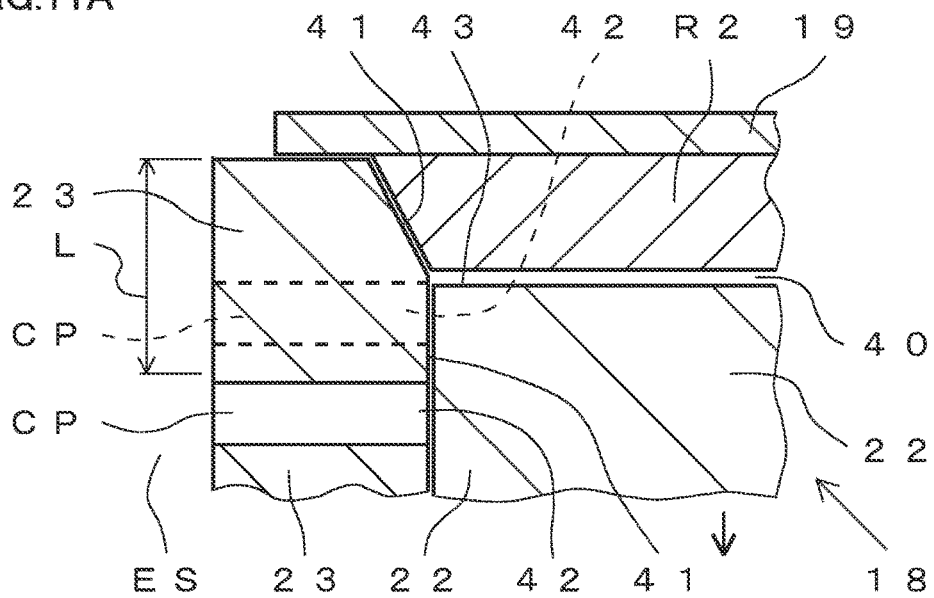
FIGS. 11A and 11B are partial cross-sectional views describing a configuration of a communicating path in the resin sealing apparatus according to the present invention, with the upper mold not shown.

FIG. 11A shows a position of communicating path CP shown in FIGS. 1 to 3. As shown in FIG. 11A, in side surface member 23, communicating path CP is provided at a position lower than a position corresponding to the thickness of sealing resin R2 to be molded (refer to FIG. 5B) with respect to the upper surface of side surface member 23. An opening 42 of communicating path CP is formed in an inner circumferential surface 41 (surface extending downwardly from inner circumferential surface 41 shown by a thick diagonal line in the figure) of side surface member 23. As a result, a gap between inner circumferential surface 41 of side surface member 23 and the outer circumferential surface of bottom surface member 22 communicates with opening 42.

After sealing resin R2 is formed, switching valve V shown in FIG. 3 is used to allow external space ES to communicate with atmosphere AT. Then, immediately after bottom surface member 22 starts to be lowered with respect to sealing resin R2, gap 40 between an upper end surface 43 of bottom surface member 22 and sealing resin R2, the gap between inner circumferential surface 41 and the outer circumferential surface of bottom surface member 22, opening 42, and communicating path CP communicate with one another. Therefore, gap 40 between upper end surface 43 of bottom surface member 22 and sealing resin R2 shown in FIG. 11A communicates with external space ES via communicating path CP, and thus, the pressure of gap 40 can become atmospheric pressure.

As to the position of communicating path CP provided in side surface member 23, there are two manners. According to the first manner, communicating path CP is provided at a position lower by a certain length than the position corresponding to the thickness of sealing resin R2, as shown by a solid line in FIG. 11A. In this case, upper end surface 43 is located at a position higher than an upper end of communicating path CP and the resin material is supplied into cavity 24 (refer to FIG. 1), and thereafter, bottom surface member 22 is raised and lowered to the position corresponding to the thickness of sealing resin R2. As a result, sealing resin R2 having a thickness corresponding to a length equal to or shorter than a prescribed length L can be molded. Prescribed length L is a length obtained by subtracting the accuracy at the time of locating upper end surface 43 from a length between the upper surface of side surface member 23 and the upper end of communicating path CP. Therefore, by using a set of lower mold 18, sealing resin R2 can be molded, with the upper limit of the thickness of sealing resin R2 being the thickness corresponding to length L.

According to the second manner, communicating path CP is provided at a position slightly lower than the position corresponding to the thickness of sealing resin R2 to be molded, as shown by a broken line in FIG. 11A. As a result, immediately after bottom surface member 22 starts to be lowered with respect to sealing resin R2, the pressure of gap 40 between bottom surface member 22 and sealing resin R2 can reliably become atmospheric pressure via opening 42 and communicating path CP.

Figure 11B:
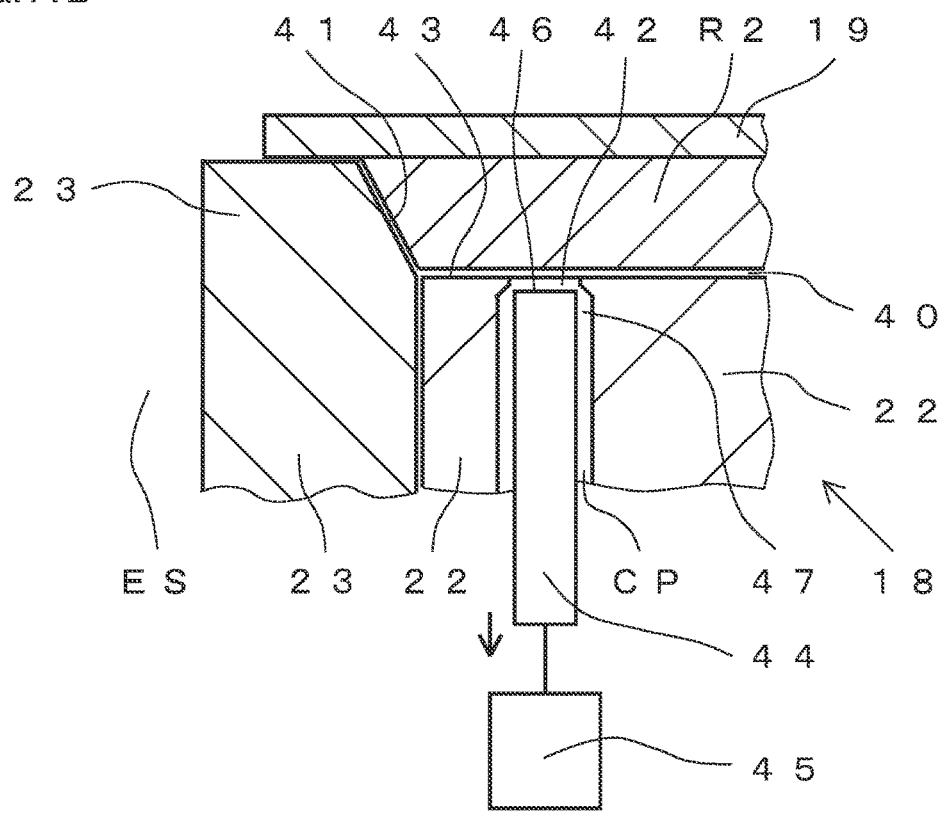

FIG. 11B shows a manner of providing communicating path CP in bottom surface member 22. Communicating path CP extends downwardly in the figure from opening 42. A columnar member 44 is provided within communicating path CP so as to be capable of advancing and retracting. Columnar member 44 advances and retracts within communicating path CP by an actuator 45. When columnar member 44 stops at a prescribed position, a top surface 46 (upper surface in the figure) of columnar member 44 forms a part of upper end surface 43 of bottom surface member 22. In other words, top surface 46 of columnar member 44 closes opening 42 in upper end surface 43 of bottom surface member 22.

Formed within communicating path CP is an enlarged portion 47 extending in the extending direction of communicating path CP (in the direction toward the outside (lower side in the figure) of bottom surface member 22) from a position slightly lower than opening 42. Enlarged portion 47 has a cross section larger than a cross section of communicating path CP. A cross-sectional shape of enlarged portion 47 is formed to include a cross-sectional shape of columnar member 44 when viewed in a plan view and have a portion enlarged as compared with the cross-sectional shape of columnar member 44. For example, opening 42 and enlarged portion 47 may be made concentric and a diameter of enlarged portion 47 may be made larger than a diameter of opening 42.

After sealing resin R2 is formed and before bottom surface member 22 starts to be lowered, columnar member 44 is lowered. As a result, before bottom surface member 22 starts to be lowered, the surface of sealing resin R2 in opening 42 communicates with external space ES via communicating path CP having opening 42 and enlarged portion 47. In other words, the surface of sealing resin R2 in opening 42 can be exposed to the atmosphere at this point of time. Therefore, immediately after bottom surface member 22 starts to be lowered with respect to sealing resin R2, the pressure of gap 40 between bottom surface member 22 and sealing resin R2 can become atmospheric pressure via communicating path CP having opening 42 and enlarged portion 47.

The configuration shown in FIG. 11A and the configuration shown in FIG. 11B may be combined. Specifically, communicating path CP having opening 42 and enlarged portion 47 shown in FIG. 11B is provided sideways in side surface member 23 shown in FIG. 11A. Inside newly-provided communicating path CP, columnar member 44 shown in FIG. 11B is advanced and retracted sideways. In this case, it is preferable to locate opening 42 at a position shown by a broken line in FIG. 11A or at a position overlapping with the upper end surface of bottom surface member 22 when viewed from the side.

According to the present embodiment, after sealing resin R2 is formed, switching valve V shown in FIG. 3 is used to allow external space ES to communicate with atmosphere AT. Then, immediately after bottom surface member 22 starts to be lowered or before bottom surface member 22 starts to be lowered, the surface of cured resin R2 communicates with external space ES. As a result, immediately after bottom surface member 22 starts to be lowered with respect to sealing resin R2, or simultaneously with this, the pressure of gap 40 between bottom surface member 22 and sealing resin R2 can become atmospheric pressure via opening 42 and communicating path CP. Therefore, breakage of sealed substrate 42 caused by the atmospheric pressure can be prevented more effectively.

Fourth Embodiment

Figure 12:
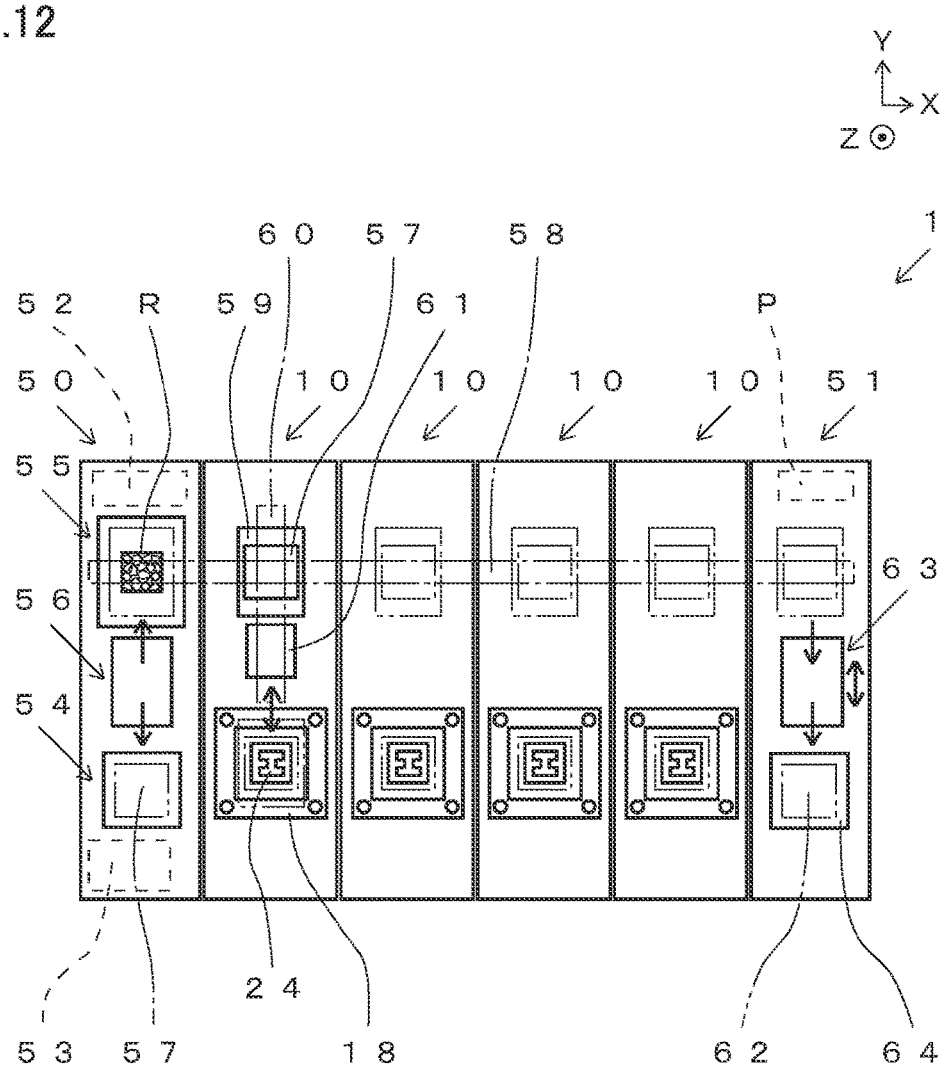
FIG. 12 is a schematic plan view showing the resin sealing apparatus according to the present invention, assuming that a member on the upper mold side has been removed.

A fourth embodiment of the resin sealing apparatus and the resin sealing method according to the present invention will be described with reference to FIG. 12. As shown in FIG. 12, resin sealing apparatus 1 has one material receiving module 50, four molding modules 10 (refer to FIG. 1), and one delivering module 51. For resin sealing apparatus 1 as a whole, resin sealing apparatus 1 has a power source 52 for supplying the electric power, and a controller 53 for controlling each component.

Material receiving module 50 and leftmost molding module 10 in FIG. 12 can be attached to and separated from each other. Adjacent molding modules 10 can be attached to and separated from each other. Rightmost molding module 10 in FIG. 12 and delivering module 51 can be attached to and separated from each other. Positioning when attaching the aforementioned components is performed by well-known means such as a hole for positioning and a positioning pin. Attachment is performed by well-known means such as screwing with a bolt and a nut.

Material receiving module 50 has a substrate material receiving portion 54, a resin material receiving portion 55 and a material transfer mechanism 56. Substrate material receiving portion 54 receives a pre-sealing substrate 57 from outside resin sealing apparatus 1. Resin material receiving portion 55 receives resin material R (refer to FIG. 1) made of a solid resin from outside resin sealing apparatus 1. FIG. 12 shows a granular resin as resin material R.

Resin sealing apparatus 1 is provided with an X-direction guide rail 58 extending along the X direction from material receiving module 50 through four molding modules 10 to delivering module 51. A main conveyance mechanism 59 is provided on X-direction guide rail 58 so as to be movable along the X direction. Main conveyance mechanism 59 is provided with a Y-direction guide rail 60 extending along the Y direction. A sub conveyance mechanism 61 (corresponding to conveyance mechanism 26 shown in FIG. 1) of main conveyance mechanism 59 is provided on Y-direction guide rail 60 so as to be movable along the Y direction. Sub conveyance mechanism 61 houses pre-sealing substrate 57 in an upper portion thereof and houses resin material R in a lower portion thereof. Sub conveyance mechanism 61 travels back and forth between an area above X-direction guide rail 58 in one molding module 10 and an area above cavity 11 in lower mold 18. Sub conveyance mechanism 61 supplies pre-sealing substrate 57 to the lower surface of the upper mold (not shown), and supplies resin material R to cavity 11 of lower mold 18.

In the present embodiment, the conveyance mechanism formed by main conveyance mechanism 59 and sub conveyance mechanism 61 conveys both pre-sealing substrate 57 and a sealed substrate 62 (corresponding to molded product M shown in FIG. 5B) which is a molded product obtained by resin-sealing and molding a chip (corresponding to component to be sealed 19a shown in FIG. 1) attached to pre-sealing substrate 57. According to this configuration, the conveyance mechanism formed by main conveyance mechanism 59 and sub conveyance mechanism 61 serves as both the carry-in mechanism and the carry-out mechanism, and thus, the configuration of resin sealing apparatus 1 is simplified.

Delivering module 51 has a molded product transfer mechanism 63 for conveying sealed substrate 62, and a magazine 64 for housing sealed substrate 62. Delivering module 51 also has vacuum pump P (refer to FIG. 1). Vacuum pump P is a pressure reducing source for reducing the pressure of the space including cavity 24. For resin sealing apparatus 1 as a whole, vacuum pump P may be used as a pressure reducing source for sucking pre-sealing substrate 57, sealed substrate 62 and the like. Vacuum pump P may be provided in material receiving module 50, or may be provided in each molding module 10.

According to the present embodiment, adjacent molding modules 10, of four molding modules 10, can be attached to and separated from each other. As a result, the number of molding modules 10 can be increased depending on an increase in demand, and the number of molding modules 10 can be decreased depending on a decrease in demand. For example, when demand for a particular product increases in a region where a factory A is located, molding module 10 used for production of the particular product is separated from resin sealing apparatus 1 of a factory B located in a region having no increase in demand. Separated molding module 10 is transported to factory A, and transported molding module 10 is added to resin sealing apparatus 1 of factory A. As a result, the increase in demand in the region where factory A is located can be dealt with. Therefore, according to the present embodiment, resin sealing apparatus 1 that can deal with an increase and decrease in demand in a flexible manner is achieved.

The following modifications can be employed as resin sealing apparatus 1. According to a first modification, material receiving module 50 and delivering module 51 are integrated, and one integrated receiving/delivering module is arranged at one end (a left end or a right end in FIG. 12) of resin sealing apparatus 1. In this case, one molding module 10 is exposed at the other end (the right end or the left end in FIG. 12) of resin sealing apparatus 1, and thus, attachment and separation of molding module 10 are easy.

According to a second modification, material receiving module 50 and one molding module 10 are integrated, and one integrated receiving/molding module is arranged at one end (the left end or the right end in FIG. 12) of resin sealing apparatus 1. In this case, one molding module 10 is attached or a plurality of molding modules 10 are sequentially attached to the receiving/molding module. Delivering module 51 is attached to molding module 10 located at the other end (the right end or the left end in FIG. 12), and resin sealing apparatus 1 is thus formed.

According to a third embodiment, in resin sealing apparatus 1, main conveyance mechanism 59 and sub conveyance mechanism 61 are both used as a carry-in mechanism, and a carry-out mechanism is provided separately from the carry-in mechanism. In this case, the carry-in mechanism and the carry-out mechanism operate independently, and thus, the efficiency of the molding operation in resin sealing apparatus 1 is enhanced.

The present invention is not limited to the aforementioned modifications. Resin sealing apparatus 1 may only be configured such that adjacent molding modules 10 can be attached to and separated from each other. The present invention is applicable to resin sealing apparatus 1 configured in this manner.

A configuration including an intermediate mold in addition to upper mold 13 and lower mold 18 may be employed as a mold 10 used in resin sealing apparatus 1 (resin molding apparatus). Lower mold 18 may be provided with a resin reservoir for housing the excessive fluid resin.

A cavity may be formed in upper mold 13 shown in FIGS. 1 to 3. In this case, the fluid resin is filled into the cavity of upper mold 13 via a through hole formed in substrate 19. An air vent hole communicating with the cavity of upper mold 13 may be provided. At least one of upper mold 13 and lower mold 18 may be provided with a resin reservoir for housing the excessive fluid resin.

Resin material R (refer to FIG. 1) supplied into cavity 24 may be a solid resin such as a powdery resin, a granular resin and a sheet-like resin, or may be a resin that is in a jellylike state at ordinary temperature (jellylike resin), or may be a resin that is in a liquid state at ordinary temperature (liquid resin). This is applied as well to resin material R (refer to FIG. 12) supplied from outside resin sealing apparatus 1.

Component to be sealed 19a (refer to FIG. 1) attached onto substrate 19 is, for example, a chip-like semiconductor element (semiconductor chip) such as an integrated circuit (IC), a transistor, a diode, and a light emitting diode. Component to be sealed 19a includes not only the semiconductor element itself but also a circuit module or the like obtained by combining the semiconductor element and a passive component (such as a resistor, a capacitor, a coil, and a filter). Molded product (sealed substrate) M manufactured by providing resin sealing for component to be sealed 19a is used as, for example, an electronic component, an electronic control unit, a power control unit or the like.

Compression molding has been described as a resin molding method to which the present invention is applied. However, the resin molding method is not limited to compression molding, and injection molding, transfer molding and the like can be employed. These methods are preferably employed when the unusual planar shape of the sealing resin is not greatly different from a simple shape. In this case, in accordance with the unusual planar shape of the sealing resin, the pressure when injecting the fluid resin into cavity 24 is adjusted appropriately and resin molding is performed. Specifically, with upper mold 13 and lower mold 18 clamped, the fluid resin is injected from outside the mold through a resin flow path (such as a runner, a spool and a gate) into cavity 24 at an appropriate pressure. Thereafter, upper mold 13 and lower mold 18 are driven similarly to each of the aforementioned embodiments.

While the embodiments of the present invention have been described, it should be understood that the embodiments disclosed herein are illustrative and not limitative in any respect. The scope of the present invention is defined by the terms of the claims, and is intended to include any modifications within the scope and meaning equivalent to the terms of the claims.

The invention claimed is:

1. A resin sealing apparatus for providing resin sealing for a component to be sealed by a sealing resin which is cured in a cavity, comprising:
   an upper mold on which a substrate is disposed, a component to be sealed being attached to the substrate;
   a lower mold provided to face the upper mold;
   a cavity provided at least in the lower mold;
   a bottom surface member forming an inner bottom surface of the cavity;
   a side surface member forming a side surface of the cavity;
   an opening provided in the side surface member and corresponding to an outer circumference of the bottom surface member;
   an opening circumferential edge portion provided in the side surface member and having an inner edge shape formed to correspond to an outer edge of an end surface planar shape, an end surface of the sealing resin having the end surface planar shape;
   an inclined surface portion provided in the side surface member and inclined to expand upwardly from the opening circumferential edge portion,
   a frame-like member provided to surround a mold having at least the upper mold and the lower mold;
   a space surrounded by the frame-like member and including the cavity;
   a seal member for shutting off the space from ambient air; and
   a pressure reducing mechanism for reducing pressure of the space with the space being shut off from the ambient air, wherein
   the side surface member is fitted to the outer circumference of the bottom surface member so as to be slidable on the outer circumference, and
   during a period from when the space is shut off from the ambient air to when a step of clamping the upper mold and the lower mold is completed, the pressure of the space shut off from the ambient air is reduced by the pressure reducing mechanism.

2. The resin sealing apparatus according to claim 1, further comprising:
   a first vertical drive mechanism for moving up and down the side surface member; and
   a second vertical drive mechanism for moving up and down the bottom surface member, wherein
   in a process of opening the upper mold and the lower mold, the first vertical drive mechanism and the second vertical drive mechanism independently drive the side surface member and the bottom surface member, respectively, and thereby, the side surface member and the bottom surface member move relatively, and
   the side surface member and the bottom surface member move relatively, and thereby, the sealing resin is released from a mold surface forming the cavity.

3. The resin sealing apparatus according to claim 2, wherein
   after a sealed substrate formed by resin sealing of the component to be sealed by the sealing resin is taken out, the first vertical drive mechanism and the second vertical drive mechanism independently drive the side surface member and the bottom surface member, respectively, and thereby, the side surface member and the bottom surface member move relatively, and
   the side surface member and the bottom surface member move relatively, and thereby, a resin burr formed between the side surface member and the bottom surface member is discharged.

4. The resin sealing apparatus according to claim 1, further comprising:
   a communicating path provided in the lower mold and allowing a mold surface forming the cavity to communicate with an external space external to the lower mold; and
   an opening formed, by the communicating path, in the mold surface forming the cavity.

5. The resin sealing apparatus according to claim 1, further comprising
   a cavity extension provided at a position and forming the end surface planar shape, the position being continuous to the inclined surface portion of the side surface member, and at the position, the side surface member and the bottom surface member are fitted to each other.

6. The resin sealing apparatus according to claim 1, further comprising
   a seal member provided in a circumferential surface of the outer circumference of the bottom surface member fitted to the side surface member, and having a closed shape when viewed in a plan view.

7. The resin sealing apparatus according to claim 1, further comprising
   a molding module having at least the upper mold and the lower mold, wherein the molding module can be attached to and detached from another molding module.

8. A resin sealing apparatus for providing resin sealing for a component to be sealed by a sealing resin which is cured in a cavity, comprising:
an upper mold on which a substrate is disposed, a component to be sealed being attached to the substrate;
a lower mold provided to face the upper mold;
a cavity provided at least in the lower mold;
a bottom surface member forming an inner bottom surface of the cavity;
a side surface member forming a side surface of the cavity;
an opening provided in the side surface member and corresponding to an outer circumference of the bottom surface member;
an opening circumferential edge portion provided in the side surface member and having an inner edge shape formed to correspond to an outer edge of an end surface planar shape, an end surface of the sealing resin having the end surface planar shape;
an inclined surface portion provided in the side surface member and inclined to expand upwardly from the opening circumferential edge portion,
a frame-like member provided to surround a mold having at least the upper mold and the lower mold;
a space surrounded by the frame-like member and including the cavity;
a seal member for shutting off the space from ambient air; and
a pressure reducing mechanism for reducing pressure of the space with the space being shut off from the ambient air, wherein
the side surface member being fitted to the outer circumference of the bottom surface member so as to be slidable on the outer circumference, and
during a period from when the space is shut off from the ambient air to when a step of clamping the upper mold and the lower mold is completed, the pressure of the space shut off from the ambient air is reduced by the pressure reducing mechanism.

9. The resin sealing apparatus according to claim 8, further comprising:
a first vertical drive mechanism for moving up and down the side surface member; and
a second vertical drive mechanism for moving up and down the bottom surface member, wherein
in a process of opening the upper mold and the lower mold, the first vertical drive mechanism and the second vertical drive mechanism independently drive the side surface member and the bottom surface member, respectively, and thereby, the side surface member and the bottom surface member move relatively, and
the side surface member and the bottom surface member move relatively, and thereby, the sealing resin is released from a mold surface forming the cavity.

10. The resin sealing apparatus according to claim 9, wherein
after a sealed substrate formed by resin sealing of the component to be sealed by the sealing resin is taken out, the first vertical drive mechanism and the second vertical drive mechanism independently drive the side surface member and the bottom surface member, respectively, and thereby, the side surface member and the bottom surface member move relatively, and
the side surface member and the bottom surface member move relatively, and thereby, a resin burr formed between the side surface member and the bottom surface member is discharged.

11. The resin sealing apparatus according to claim 8, further comprising:
a communicating path provided in the lower mold and allowing a mold surface forming the cavity to communicate with an external space external to the lower mold; and
an opening formed, by the communicating path, in the mold surface forming the cavity.

12. The resin sealing apparatus according to claim 8, further comprising
a cavity extension provided at a position and forming the end surface planar shape, the position being continuous to the inclined surface portion of the side surface member, and at the position, the side surface member and the bottom surface member are fitted to each other.

13. The resin sealing apparatus according to claim 8, further comprising
a seal member provided in a circumferential surface of the outer circumference of the bottom surface member fitted to the side surface member, and having a closed shape when viewed in a plan view.

14. The resin sealing apparatus according to claim 8, further comprising
a molding module having at least the upper mold and the lower mold, wherein
the molding module can be attached to and detached from another molding module.

15. The resin sealing apparatus according to claim 1, wherein
the end surface planar shape includes a shape selected from the group consisting of:
a shape having a cutaway portion or a projecting portion on one side or a plurality of sides of a rectangular shape;
a substantially circular shape having a cutaway portion or a projecting portion; and
a polygonal shape other than the rectangular shape.

16. The resin sealing apparatus according to claim 8, wherein
a planar shape of a portion where the sealing resin is in close contact with the substrate includes a shape selected from the group consisting of:
a shape having a cutaway portion or a projecting portion on one side or a plurality of sides of a rectangular shape;
a substantially circular shape having a cutaway portion or a projecting portion; and
a polygonal shape other than the rectangular shape.

* * * * *